United States Patent
Lee et al.

(10) Patent No.: US 9,029,895 B2
(45) Date of Patent: May 12, 2015

(54) ULTRAVIOLET LIGHT EMITTING DEVICE

(71) Applicant: LG Innotek Co., Ltd., Seoul (KR)

(72) Inventors: Kwang chil Lee, Seoul (KR); Joong Seo Park, Seoul (KR); Tae Lim Lee, Seoul (KR); Woon Kyung Choi, Seoul (KR); Kyoung Hoon Kim, Seoul (KR); Hae Jin Park, Seoul (KR); Hwan Hui Yun, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/911,853

(22) Filed: Jun. 6, 2013

(65) Prior Publication Data

US 2014/0084317 A1   Mar. 27, 2014

(30) Foreign Application Priority Data

Sep. 24, 2012   (KR) .................. 10-2012-0105933

(51) Int. Cl.
*H01L 33/00* (2010.01)
*H01L 33/58* (2010.01)

(52) U.S. Cl.
CPC .......... *H01L 33/58* (2013.01); *H01L 2924/0002* (2013.01); *H01L 2224/13* (2013.01); *H01L 2224/48091* (2013.01)

(58) Field of Classification Search
CPC ....................................................... H01L 33/58
USPC ........................................................... 257/98
See application file for complete search history.

(56) References Cited

U.S. PATENT DOCUMENTS

| | | | | |
|---|---|---|---|---|
| 7,157,294 B2 * | 1/2007 | Uemura et al. | ................. | 438/27 |
| 7,196,354 B1 * | 3/2007 | Erchak et al. | ................... | 257/79 |
| 7,277,609 B2 * | 10/2007 | Cassarly | ......................... | 385/31 |
| 7,932,534 B2 * | 4/2011 | Singh et al. | ..................... | 257/98 |

* cited by examiner

*Primary Examiner* — David S Blum
(74) *Attorney, Agent, or Firm* — Ked & Associates, LLP

(57) ABSTRACT

Disclosed is a light emitting device including an active layer emitting light with a wavelength band of 200 nm to 405 nm, and a light-transmitting layer disposed on the active layer, the light-transmitting layer having a lower part facing the active layer, wherein at least one of side and upper parts of the light-transmitting layer has a surface-processed pattern portion.

20 Claims, 30 Drawing Sheets

ULTRAVIOLET LIGHT EMITTING DEVICE

CROSS REFERENCE TO RELATED APPLICATION

This application claims priority under 35 U.S.C. §119 to Korean Patent Application No. 10-2012-0105933, filed in Korea on 24 Sep. 2012, which is hereby incorporated in its entirety by reference as if fully set forth herein.

TECHNICAL FIELD

Embodiments relate to an ultraviolet light emitting device.

BACKGROUND

Light emitting diodes (LEDs) are semiconductor devices which send and receive a signal by converting electricity into infrared light or visible light using characteristics of compound semiconductors or which are used as light sources.

Group III-V nitride semiconductors receive much attention as essential materials for light emitting devices such as light emitting diodes (LEDs) or laser diodes (LDs) due to physical and chemical properties thereof.

Such a light emitting diode does not contain environmentally harmful substances such as mercury (Hg) used in conventional lighting apparatuses such as incandescent lamps or fluorescent lamps and thus advantageously has superior eco-friendliness, long lifespan and low power consumption, thus being used as alternatives of conventional light sources.

FIG. 1 is a sectional view of an LED having a general flip bonding structure.

The LED shown FIG. 1 includes a submount 10, a passivation layer 12, first and second electrode pads 14 and 16, bumps 18, 20 and 22, first and second electrode layers 24 and 26, a semiconductor layer 30, an AlN layer 40 and a sapphire substrate 42. The semiconductor layer 30 includes a p-type semiconductor layer 32, an active layer 34 and an n-type semiconductor layer 36.

In the LED shown in FIG. 1, light emitted from the active layer 34 passes through the n-type semiconductor layer 36 and the AlN layer 40 and then exits through the sapphire substrate 42 upwardly. At this time, in accordance with Snell's Law, due to a difference in index of refraction between the n-type semiconductor layer 36, the AlN layer 40 and the sapphire substrate 42, a part 2 of light emitted from the active layer 34 does not escape from the sapphire substrate 42, undergoes total internal reflection and is absorbed in the semiconductor layer 30, thus causing deterioration in luminous efficacy.

When the LED shown in FIG. 1 is a blue LED emitting a blue wavelength band of light, the AlN layer 40 may be omitted and the n-type semiconductor layer 36 may be formed of GaN. However, when the LED shown in FIG. 1 is a DUV LED emitting a deep ultraviolet (DUV) wavelength band of light, the AlN layer 40 is formed and the n-type semiconductor layer 36 is formed of AlGaN. The AlN has an index of refraction of 2.3, the sapphire substrate 42 has an index of refraction of 1.82 and the air contacting the sapphire substrate 42 has an index of refraction of 1. Accordingly, a difference in index of refraction between media present in a light passage greatly increases, disadvantageously, total internal reflection loss is maximized and light extraction efficiency is thus deteriorated.

FIG. 2 is a view comparing a dose of light which exits from a side surface of a sapphire substrate 50 in case of a blue LED and a DUV LED, wherein $\Theta_A$ represents an angle of incidence and $\Theta_B$ represents an angle of refraction.

The reference numeral '52' of FIG. 2 corresponds to the GaN buffer layer 40 or the GaN light emitting structure 36 in the case of the blue LED, and corresponds to the AlN layer 40 in the case of the DUV LED. In this case, assuming that a wavelength (λ) of light emitted from the blue LED is 450 nm and a wavelength (λ) of light emitted from the DUV LED is 280 nm, indexes of refraction of the respective layers 50 and 52 are shown in the following Table 1.

TABLE 1

| Types | Index of refraction (λ = 280 nm) | Index of refraction (λ = 450 nm) |
| --- | --- | --- |
| AlN | 2.31 | 2.18 |
| GaN | 2.71 | 2.48 |
| Sapphire | 1.82 | 1.78 |

Also, a total internal reflection angle $\Theta_{TIR}$, an angle of incidence $\Theta_A$ and an angle of refraction $\Theta_B$ of a blue LED having a wavelength (λ) of 450 nm and a DUV LED having a wavelength (λ) of 280 nm are shown in the following Table 2.

TABLE 2

| | | | $\Theta_B$ (°) | | |
| --- | --- | --- | --- | --- | --- |
| Types | λ (nm) | $\Theta_{TIR}$ (°) | $\Theta_A = 15°$ | $\Theta_A = 30°$ | $\Theta_A = 40°$ |
| AlN/Sapphire boundary | 280 nm | 52.47 | 19 | 39 | 54 |
| Sapphire/air boundary | | 33.24 | | | |
| GaN/Sapphire boundary | 450 nm | 45.86 | 21 | 44 | 64 |
| Sapphire/air boundary | | 34.18 | | | |

It can be seen from Tables 1 and 2 that, since, in the same angle of incidence $\Theta_A$, an angle of refraction $\Theta_B$ at an GaN/sapphire boundary having a wavelength of 450 nm is larger than an angle of refraction $\Theta_B$ at an AlN/sapphire boundary having a wavelength of 280 nm, light escaping from the GaN/sapphire boundary having a wavelength of 450 nm progresses near a horizontal plane. However, since the total internal reflection critical angle ($\Theta_{TIR}$), at AlN/sapphire boundary having a wavelength of 280 nm is larger than the total internal reflection critical angle ($\Theta_{TIR}$) at GaN/sapphire boundary having a wavelength of 450 nm, light of 6.61° (=52.47−45.86) corresponding to a critical angle difference is emitted in a greater amount from the 280 nm AlN/sapphire boundary through the sapphire substrate 50, as compared to the 450 nm GaN/sapphire boundary, when light is uniformly radiated in a spherical shape at all angles from the active layer 34 (MQW) of the LED. Accordingly, a dose of light which exits from a lower part of a sidewall of the sapphire substrate 50 in the DUV LED is greater than that in the blue LED.

As such, as compared with the blue LED, the DUV LED may exhibit deteriorated light extraction efficiency, since a great amount of light emitted from the active layer 34 may exit to the lower part of the sidewall of the sapphire substrate 42.

SUMMARY

Embodiments provide an ultraviolet light emitting device with improved light extraction efficiency.

In one embodiment, a light emitting device includes an active layer emitting light with a wavelength band of 200 nm to 405 nm, and a light-transmitting layer disposed on the active layer, the light-transmitting layer having a lower part facing the active layer, wherein at least one of side and upper parts of the light-transmitting layer has a surface-processed pattern portion.

The pattern portion may be disposed in at least one of a total internal reflection region and a non-maximum light emitting region.

The total internal reflection region may be defined as follows:

$$\left(\frac{a+b_1}{2}\right)\tan\theta_{TIR} < y < h$$

$$0 < x < \frac{b_1 - a}{2} - h\tan\theta_{TIR}, \frac{a+b_1}{2} + h\tan\theta_{TIR} < x < b_1$$

where 'y' represents a position of the light-transmitting layer in a thickness direction, 'x' represents a position of the light-transmitting layer in a width direction, 'a' represents a width of the active layer, $b_1$ represents a width of the lower surface of the light-transmitting layer, $\Theta_{TIR}$ represents a total internal reflection angle of the light-transmitting layer, and h represents a thickness of the light-transmitting layer.

The pattern portion may be disposed in at least one of the upper part of the light-transmitting layer, and lower, intermediate and upper portions of the side part of the light-transmitting layer.

The lower portion of the side part of the light-transmitting layer in which the pattern portion is disposed may be defined as follow:

$$0 < y < \frac{b_1}{2}$$

where 'y' represents a position of the light-transmitting layer in a thickness direction and $b_1$ represents a width of the lower surface of the light-transmitting layer.

The pattern portion may be surface-processed to provide random roughness.

The surface-processing may include at least one of lapping and polishing, and a roughness level of the random roughness may be proportional to a polishing particle size. The polishing particle size may be 0.5 μm to 6 μm.

The surface-processing may include laser scribing, dry etching, or wet etching.

The pattern portion may be surface-processed into a hemispherical shape. A radius of the hemisphere may be at least half a width of the lower surface of the light-transmitting layer.

The pattern portion may be surface-processed such that an upper surface and a lower surface of the light-transmitting layer have areas different from each other. The light-transmitting layer may include a lower cut portion having a horizontal cross-section having the same shape as the lower surface, and an upper cut portion being disposed on the lower cut portion and having a plurality of different horizontal cross-sections between an upper surface of the lower cut portion, and the upper surface of the light-transmitting layer.

An area of the lower surface of the light-transmitting layer may be larger than that of the upper surface. A side part of the upper cut portion may have at least one inclined plane and the surface of the inclined plane may have a roughness.

The following relation may be present between a width of the upper surface and a width of the lower surface of the light-transmitting layer.

$$b_1 - b_2 = 2d \tan \Theta_1$$

where $b_1$ represents a width of the lower surface, $b_2$ represents a width of the upper surface, 'd' represents a thickness of the upper cut portion and $\Theta_1$ represents an inclination angle of the inclined plane.

The light-transmitting layer may have a width of 50 μm to 250 μm, the lower cut portion may have a thickness of 25 μm to 100 μm, and the inclined plane may have an inclination angle of 30° to 40°. For example, the width of the light-transmitting layer is 100 μm and the thickness of the lower cut portion is 50 μm.

The upper cut portion may have a head-truncated pyramidal shape.

The inclined plane may have a concave or convex curvature at an outside.

An area of the upper surface of the light-transmitting layer may be larger than that of the lower surface. The upper cut portion may have at least one projection at an edge thereof. The upper cut portion may have a reverse head-truncated pyramidal shape.

The upper part of the light-transmitting layer may have uniform irregularities as the pattern portion.

A period of the irregularities may be λ/4, wherein λ is a wavelength of the light.

The ultraviolet light emitting device may further include a substrate, a first conductive type semiconductor layer disposed between the substrate and the active layer, and a second conductive type semiconductor layer disposed on the active layer, wherein the light-transmitting layer includes the second conductive type semiconductor layer. Alternatively, the ultraviolet light emitting device may further include a second conductive type electrode layer disposed on the second conductive type semiconductor layer, wherein the light-transmitting layer further includes the second conductive type electrode layer.

The ultraviolet light emitting device may further include a first conductive type semiconductor layer disposed on the active layer, a second conductive type semiconductor layer disposed under the active layer, and a substrate disposed on the first conductive type semiconductor layer, wherein the light-transmitting layer includes the substrate.

In another embodiment, an ultraviolet light emitting device includes a light emitting structure including a p-type semiconductor layer, an active layer emitting light with a wavelength band of 200 nm to 405 nm and an n-type AlGaN layer, and a sapphire substrate disposed on the n-type AlGaN layer and having a lower part facing the active layer, wherein a pattern portion having roughness is formed in at least one of a lower portion of the side part of the sapphire substrate and an edge of the upper part of the sapphire substrate.

The lower portion of the side part of the sapphire substrate may be defined as follows, and $$0 < y < \frac{b_1}{2}$$

the edge of the upper part may be defined as follows:

$$0 < x < \frac{b_1 - a}{2} - h\tan\theta_{TIR}, \frac{a + b_1}{2} + h\tan\theta_{TIR} < x < b_1$$

where 'y' represents a position of the sapphire substrate in a thickness direction, $b_1$ represents a width of the lower surface of the sapphire substrate, 'x' represents a position of the sapphire substrate in a width direction, 'a' represents a width of the light emitting structure, $b_1$ represents a width of the lower surface of the sapphire substrate, $\Theta_{TIR}$ represents a total internal reflection angle of the sapphire substrate and h represents a thickness of the sapphire substrate.

In addition, the ultraviolet light emitting device may further include an AlN layer disposed between the n-type AlGaN layer and the sapphire substrate.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
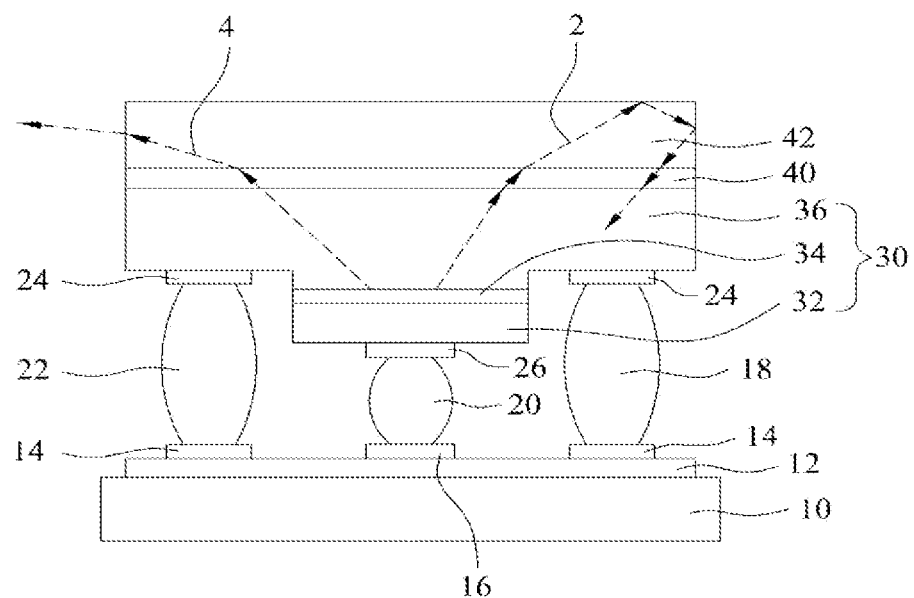
FIG. 1 is a sectional view of an LED having a general flip bonding structure.
Figure 2:
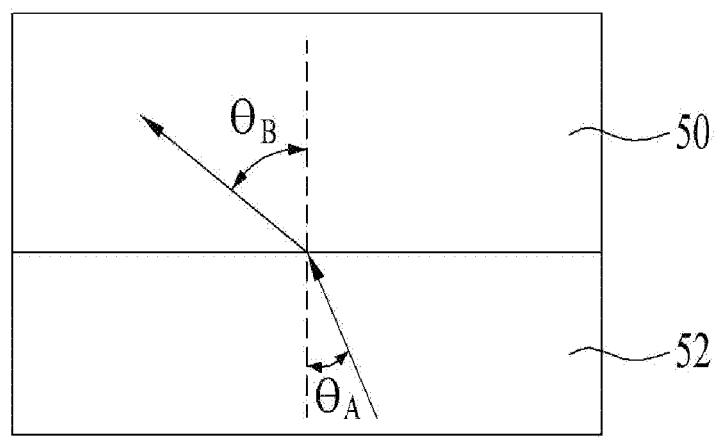
FIG. 2 is a view comparing a dose of light which exits from a side surface of a sapphire substrate in case of a blue LED and a DUV LED.

Hereinafter, embodiments will be described with reference to the annexed drawings.

It will be understood that when an element is referred to as being "on" or "under" another element, it can be directly on/under the element, and one or more intervening elements may also be present. When an element is referred to as being 'on' or 'under', 'under the element' as well as 'on the element' can be included based on the element.

In the drawings, the thickness or size of each layer is exaggerated, omitted, or schematically illustrated for convenience of description and clarity. Also, the size or area of each constituent element does not entirely reflect the actual size thereof.

In an embodiment, the ultraviolet light emitting device includes an LED including a plurality of compound semiconductor layers, for example, Group III-V or II-VI element compound semiconductor layers, and the LED may be an ultraviolet (UV) LED or a deep ultraviolet (DUV) LED.

The ultraviolet light emitting device includes an active layer and a light-transmitting layer. The active layer may emit ultraviolet light having a wavelength band of 200 nm to 405 nm, in particular, deep ultraviolet light having a wavelength band of 200 nm to 350 nm. The light-transmitting layer is disposed on the active layer and has a lower part facing the active layer. In the present embodiment, at least one of side and upper parts of the light-transmitting layer has a surface-processed pattern portion. As such, when the light-transmitting layer has the pattern portion, light extraction efficiency of the ultraviolet light emitting device may be improved.

Hereinafter, all areas which are surface-processed by cutting and/or are surface-processed to have a random roughness in at least one of side and upper parts of the light-transmitting layer correspond to the pattern portions.

<Ultraviolet Light Emitting Device Having Flip Chip Bonding Structure>

Hereinafter, details of the active layer and the light-transmitting layer when the ultraviolet light emitting device according to the embodiment has a flip chip bonding structure will be described with reference to the annexed drawings.

Figure 3:
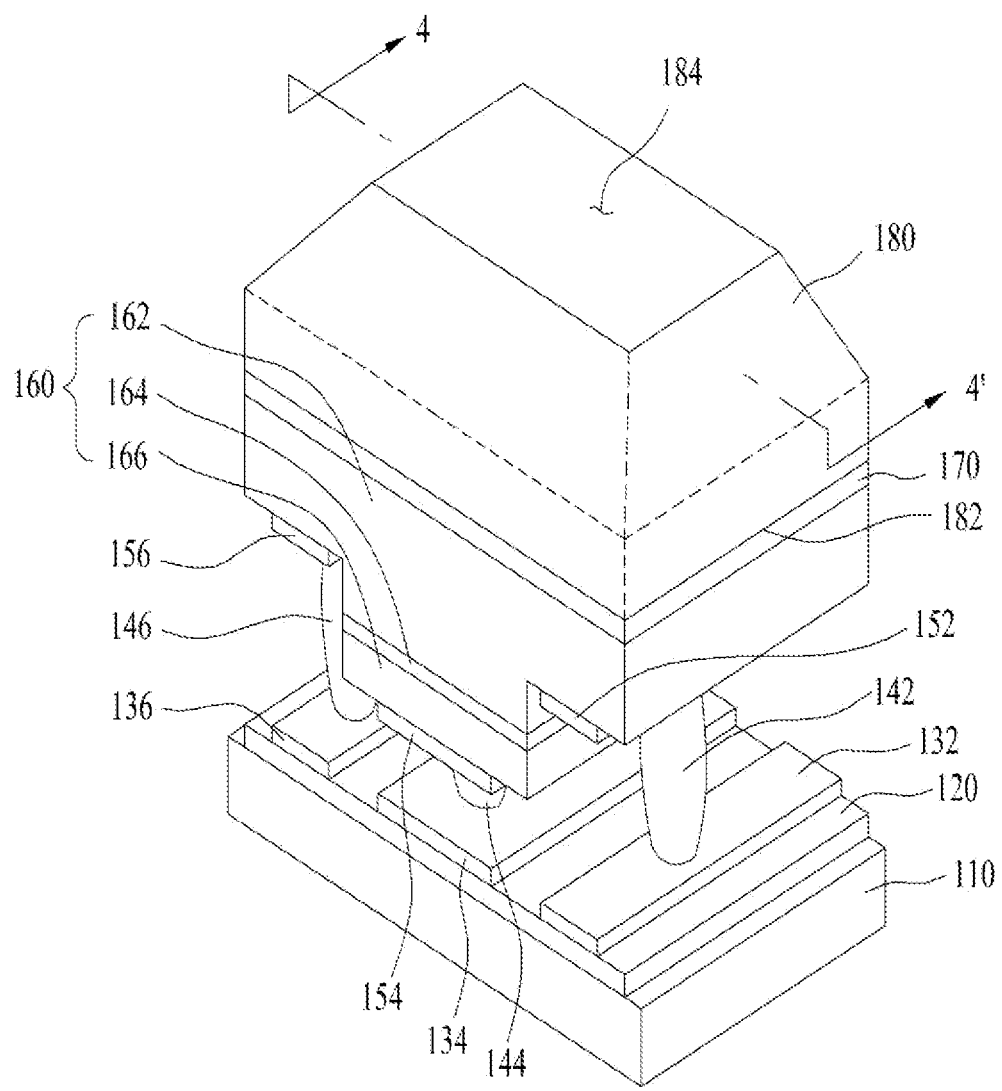
FIG. 3 is a perspective view illustrating an ultraviolet light emitting device according to one embodiment.
Figure 4:
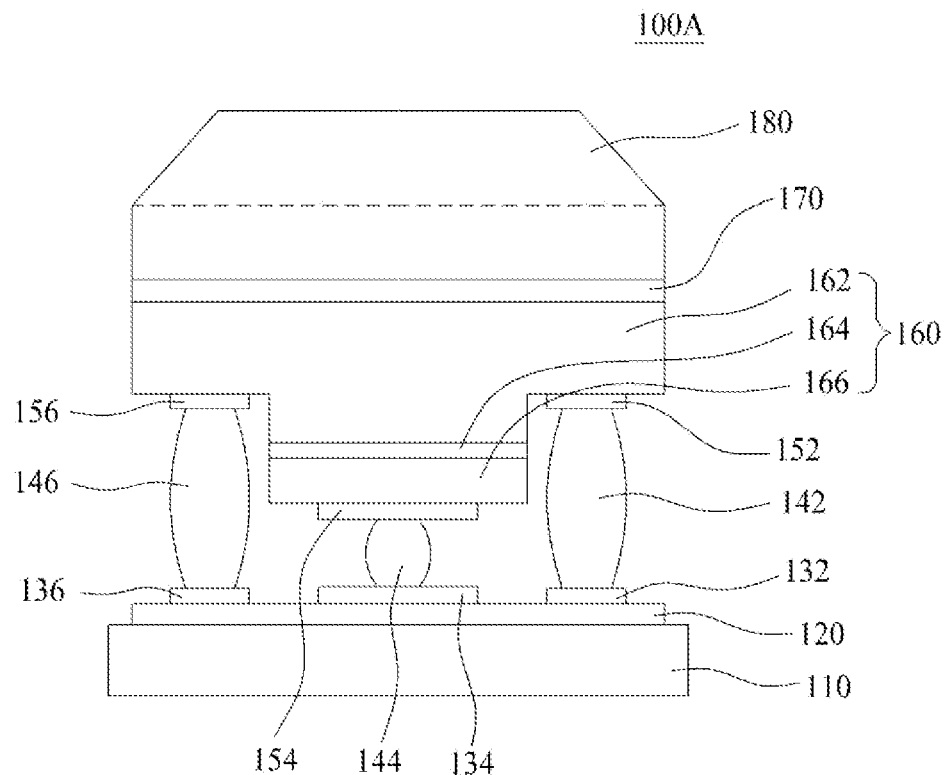
FIG. 4 is a sectional view taken along the line 4-4' of FIG. 3.
Figure 5:
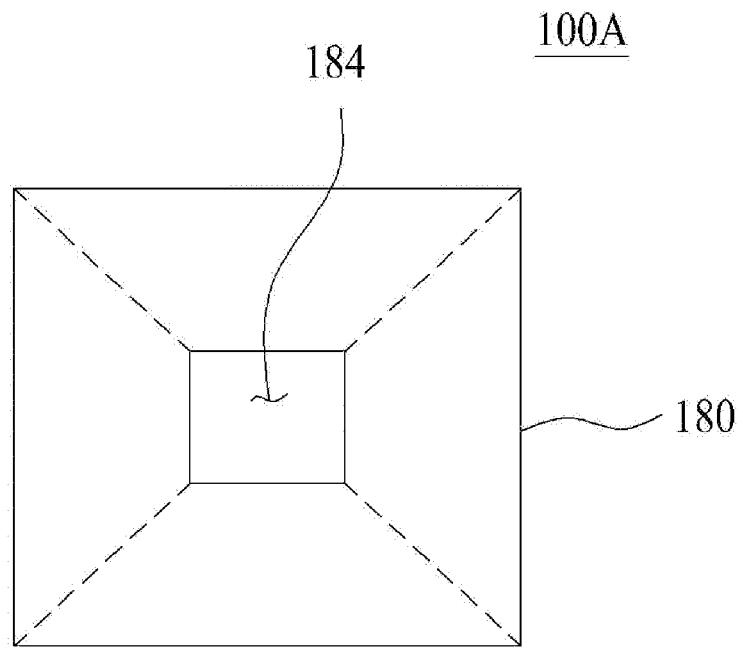
FIG. 5 is a plan view of the ultraviolet light emitting device shown in FIG. 3.

FIG. 3 is a perspective view illustrating an ultraviolet light emitting device 100A according to one embodiment. FIG. 4 is a sectional view taken along the line 4-4' of FIG. 3. FIG. 5 is a plan view of ultraviolet light emitting device 100A shown in FIG. 3.

Referring to FIGS. 3 to 5, the ultraviolet light emitting device 100A includes a submount 110, a passivation layer 120, first electrode pads 132 and 136, a second electrode pad 134, first bumps 142 and 146, a second bump 144, first electrode layers 152 and 156, a second electrode layer 154, a light emitting structure 160, a buffer layer 170 and a substrate 180.

The first electrode layer 152 or 156 and the second electrode layer 154 of the ultraviolet light emitting device 100A shown in FIG. 3 are disposed on the submount 110 by a flip manner.

Namely, the first electrode layers 152 and 156 of the ultraviolet light emitting device 100A are connected to the first electrode pads 132 and 136 of the submount 110 through the first bumps 142 and 146, and the second electrode layer 154 is connected through the second bump 144 to the second electrode pad 134 of the submount 110. For example, the submount 110 may be formed of a semiconductor substrate containing silicon carbide (SiC), GaN, GaAs or Si. When the submount 110 is formed of Si, a protective layer 120 may be further provided, as shown in FIG. 3.

A first upper bump metal layer (not shown) may be disposed between the first bumps 142 and 146, and the first electrode layers 152 and 156, and a first lower bump metal layer (not shown) may be further disposed between the first bumps 142 and 146, and the first electrode pads 132 and 136 in order to mark positions at which the first bumps 142 and 146 are disposed. In addition, in order to mark a position at which the second bump 144 is disposed, a second upper bump metal layer (not shown) may be disposed between the second bump 144 and the second electrode layer 154 and a second lower bump metal layer (not shown) may be disposed between the second bump 144 and the second electrode pad 134.

The first electrode layers 152 and 156 may be disposed under the first conductive type semiconductor layer 162 and the second electrode layer 154 may be disposed under the second conductive type semiconductor layer 166. The first and second electrode layers 152 to 156 may be formed of a metal such as Ag, Ni, Al, Rh, Pd, Ir, Ru, Mg, Zn, Pt, Au, Hf or a combination thereof. In addition, the first and second electrode layers 152 to 156 may have a monolayer or multilayer structure using a reflective electrode material having an ohmic property.

For example, the first and second electrode layers 152 to 156 may contain the afore-mentioned metal material and at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO, but the disclosure is not limited to these materials.

The first and second electrode layers 152 to 156 may contain materials which ohmic-contact the first and second conductive type semiconductor layers 162 and 166, respectively. When the first and second electrode layers 152 to 156 function as ohmic layers, an additional ohmic layer (not shown) need not be formed.

The afore-mentioned first electrode pads 132 and 136, the second electrode pad 134, the protective layer 120, the submount 110, and the first and second electrode layers 152 to 156 are provided only for better understanding of the embodiments and the present embodiment is not limited thereto.

Next, the light emitting structure 160 is disposed under the substrate 180. The light emitting structure 160 includes a first conductive type semiconductor layer 162, an active layer 164 and a second conductive type semiconductor layer 166.

The first conductive type semiconductor layer 162 may disposed under the substrate 180 and may be formed of a semiconductor compound. The first conductive type semiconductor layer 162 may be realized with a compound semiconductor containing Group III-V elements, Group II-VI elements or the like and may be doped with a first conductive type dopant. For example, the first conductive type semiconductor layer 162 may be formed of a semiconductor material having a compositional formula of $Al_xIn_yGa_{(1-x-y)}N$ ($0 \le x \le 1$, $0 \le y \le 1$, $0 \le x+y \le 1$), or InAlGaN. When the first conductive type semiconductor layer 162 is an n-type semiconductor layer, the first conductive type dopant may contain n-type dopant such as Si, Ge, Sn, Se, or Te. The first conductive type semiconductor layer 162 may have a monolayer or multilayer structure, but the disclosure is not limited thereto.

The active layer 164 may be disposed between the first conductive type semiconductor layer 162 and the second conductive type semiconductor layer 164 and may have a single well structure, double heterostructure, a multiple well structure, a single quantum well structure, a multi quantum well (MQW) structure, a quantum dot structure, or a quantum wire structure. The active layer 164 may be formed to have a pair structure including a well layer and a barrier layer using a Group III-V compound semiconductor material, for example, at least one of InGaN/GaN, InGaN/InGaN, GaN/AlGaN, InAlGaN/GaN, GaAs(InGaAs)/AlGaAs, and GaP (InGaP)/AlGaP, but the disclosure is not limited thereto. The well layer may be formed of a material having a smaller energy band gap than an energy band gap of the barrier layer. In particular, the active layer 164 according to the embodiment may generate ultraviolet light with a wavelength band of 200 nm to 405 nm, in particular, deep ultraviolet light with a wavelength band of 200 nm to 350 nm.

A conductive type clad layer (not shown) may be formed between the active layer 164 and the first conductive type semiconductor layer 162 or between the active layer 164 and the second conductive type semiconductor layer 166.

The conductive type clad layer may be formed of a material having a wider band gap than a band gap of the barrier layer of the active layer 164. For example, the conductive type clad layer may have a GaN, AlGaN, InAlGaN, superlattice structure or the like. In addition, the conductive type clad layer may be doped with an n-type or p-type dopant.

The second conductive type semiconductor layer 166 may be disposed under the active layer 164 and be formed of a semiconductor compound. The second conductive type semiconductor layer 166 may be realized with a Group III-V or Group II-VI compound semiconductor and be doped with a second conductive type dopant. For example, the second conductive type semiconductor layer 166 may be formed of a semiconductor material having a compositional formula of $In_xAl_yGa_{1-x-y}N$ ($0 \le x \le 1$, $0 \le y \le 1$, $0 \le x+y \le 1$) or InAlGaN. When the second conductive type semiconductor layer 166 is a p-type semiconductor layer, the second conductive type dopant may be a p-type dopant such as Mg, Zn, Ca, Sr or Ba. The second conductive type semiconductor layer 166 may have a monolayer or multilayer structure, but the disclosure is not limited thereto.

The buffer layer 170 may be further disposed between the substrate 180 and the light emitting structure 160. The buffer layer 170 functions to reduce lattice mismatch between the substrate 180 and the light emitting structure 160 and may be formed of AlN.

Meanwhile, the substrate 180 may have a light-transmitting property and be formed of at least one of sapphire ($Al_2O_3$), SiC, GaAs, GaN, ZnO, Si, GaP, InP, and Ge, but the disclosure is not limited thereto.

In addition, the substrate 180 may have mechanical strength so that it can be efficiently separated into respective chips through scribing and breaking processes without causing an overall nitride semiconductor to bow.

The substrate 180 shown in FIGS. 3 to 5 corresponds to the light-transmitting layer as described above. A lower part of the substrate 180 which is the light-transmitting layer faces the light emitting structure 160, namely, the active layer 164, and at least one of side and upper parts of the substrate 180 has a surface-processed pattern portion.

Hereinafter, all areas which are surface-processed by cutting and/or are surface-processed to have a random roughness in a surface of at least one of side and upper parts of the substrate 180 correspond to pattern portions.

First, the pattern portion formed by surface-processing the surface of at least one of side and upper parts of the substrate 180 by cutting according to a first embodiment will be described below.

The pattern portion of the substrate 180 shown in FIGS. 3 to 5 according to the embodiment will be described with reference to the annexed drawings below.

In the present embodiment, the pattern portion of the substrate 180 is disposed in at least one of a total internal reflection region (TIR) and a non-maximum light emitting region.

Figure 6:
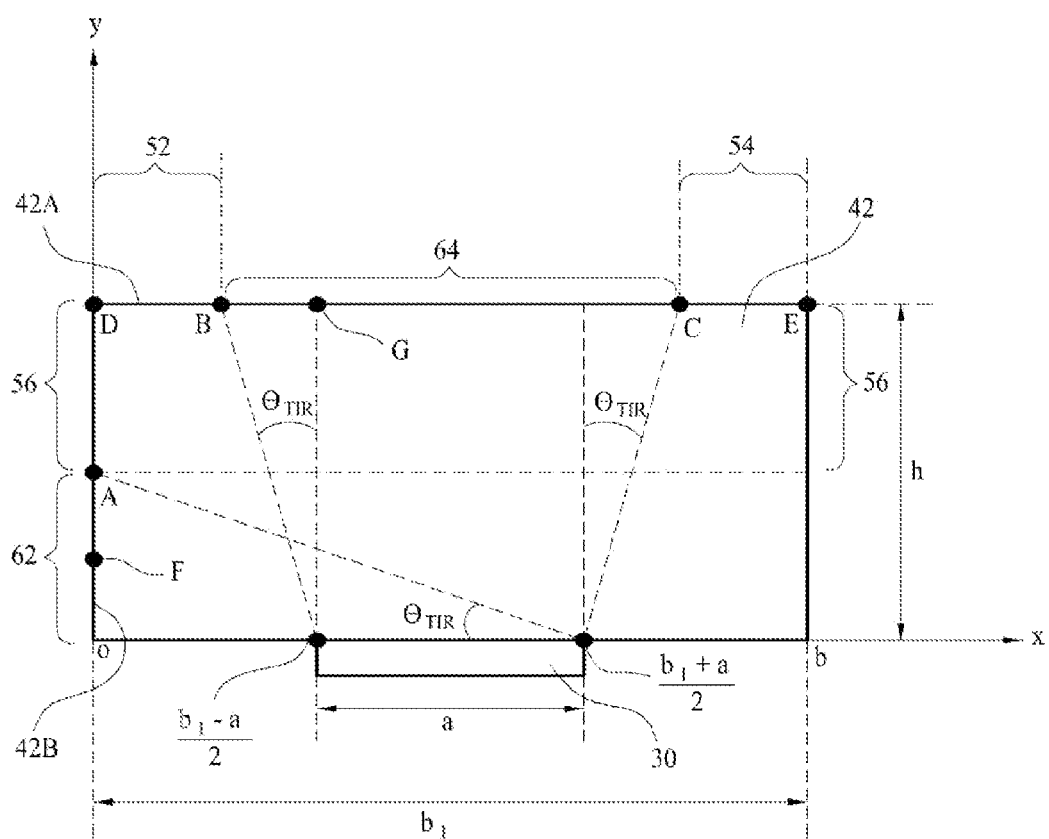
FIG. 6 is a sectional view illustrating a semiconductor layer and a substrate of the general LED shown in FIG. 1 for description of a total internal reflection region and a non-maximum light emitting region.

FIG. 6 is a sectional view illustrating the semiconductor layer 30 and the substrate 42 of the general LED shown in FIG. 1 for description of the total internal reflection region and the non-maximum light emitting region, and the total internal reflection region and the non-maximum light emitting region are described using a cartesian coordinate system. Here, a longitudinal axis (y) represents a position of the substrate 42 in a thickness (or height) direction of the substrate 42 and a horizontal axis (x) represents a position of the substrate 42 in a width direction of the substrate 42.

First, the description is based on the assumption that light reflected two or more times within the substrate 42 is absorbed in the p-type semiconductor layer 32 disposed under the substrate 42, that light is scattered in all directions, and that the semiconductor layer 30 is disposed under an exact center of the substrate 42.

The total internal reflection regions 52, 54 and 56 shown in FIG. 6 may be defined by the following Equation 1.

$$A < y < D, \text{ i.e., } \left(\frac{a+b_1}{2}\right) \tan\theta_{TIR} < y < h \quad \text{Equation 1}$$

$$D < x < B, \text{ i.e., } 0 < x < \frac{b_1 - a}{2} - h\tan\theta_{TIR}$$

$$C < x < E, \text{ i.e., } \frac{a+b_1}{2} + h\tan\theta_{TIR} < x < b_1$$

where 'a' represents a width of the light emitting structure 30 (or active layer 32), $b_1$ represents a width of the lower surface of the substrate 42, $\Theta_{TIR}$ represents a total internal reflection angle of the substrate 42, and h represents a thickness (or height) of the substrate 42.

In the total internal reflection regions 52, 54 and 56, light does not escape from the substrate 42. Light may escape from the substrate 42 only in emission regions 62 and 64. The emission regions 62 and 64 refer to an area between a point O and a point A in the longitudinal axis (y) and an area between a point B and a point C on an upper surface 42A of the substrate 42 in the horizontal axis (x), respectively.

In addition, the non-maximum light emitting region is defined as an area in which light may not exit at maximum. Referring to FIG. 6, the non-maximum light emitting region, for example, is a part in which a point F is connected to a point G, or areas of (0, F<y<h) and (0<x<($b_{1-a}$)/2, h) provided between the points F and G, namely, F-A-D-B-G. A y axis coordinate of F is 0≤F≤A.

In the present embodiment, light can escape from the substrate 42 by surface-processing the total internal reflection regions 52, 54 and 56 present on the upper surface 42A and a side surface 42B of the substrate 42, thereby improving light extraction efficiency. In addition, more light can escape from the substrate 42 through the non-maximum light emitting regions by surface-processing the non-maximum light emitting regions present on the upper surface 42A and the side surface 42B of the substrate 42, thereby improving light extraction efficiency.

According to the first embodiment, as an example of surface-processing, at least one of the total internal reflection regions 52, 54 and 56 and the non-maximum light emitting region present on the upper surface 42A and the side surface 42B of the substrate 42 may be cut. For example, the cutting may be carried out using a laser.

When at least one of the total internal reflection regions and the non-maximum light emitting regions present on the substrate 42 is surface-processed by being cut into various shapes, the lower surface 182 and the upper surface 184 of the substrate 180 may have different areas. Hereinafter, a case in which the pattern portion is formed in the total internal reflection region will be described for convenience of description, but the description may be similarly applied to a case in which the pattern portion is formed in the non-maximum light emitting region.

First, an area of the lower surface 182 of the substrate 180 may be larger than an area of the upper surface 184 through surface-processing.

Figure 7:
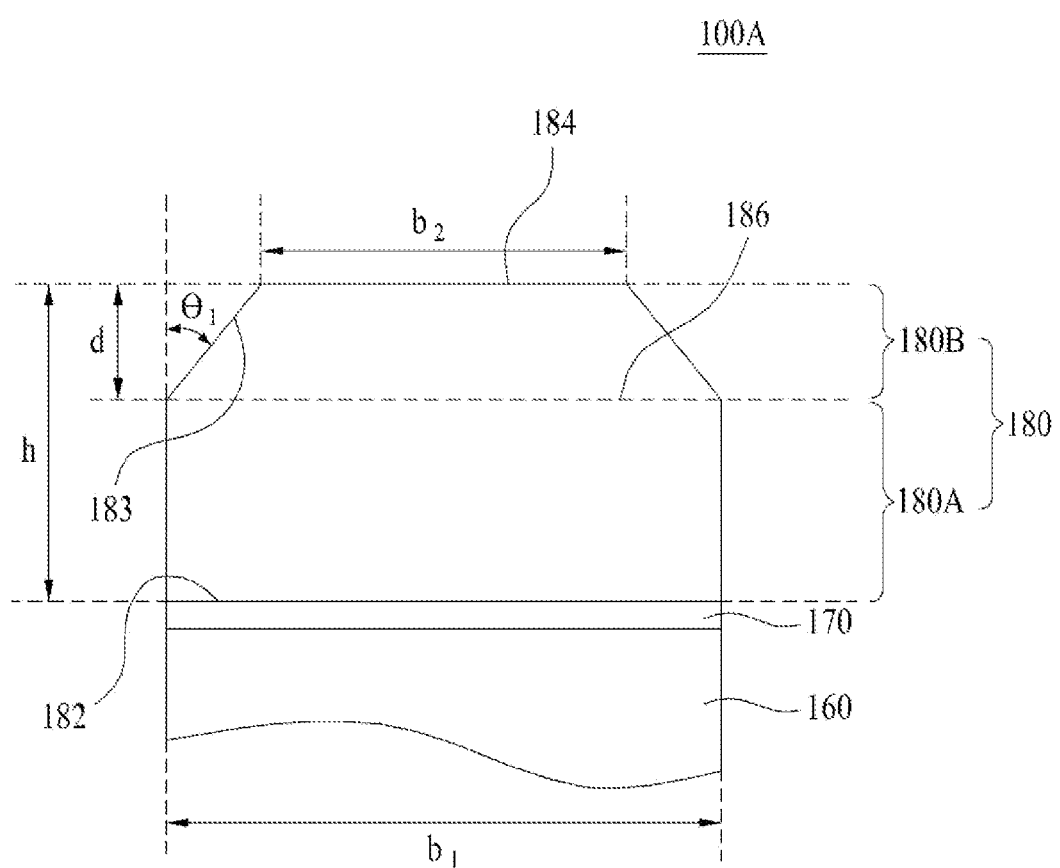
FIG. 7 is an enlarged sectional view illustrating a pattern portion of a surface-processed substrate in the ultraviolet light emitting device shown in FIGS. 3 to 5.

FIG. 7 is an enlarged sectional view illustrating the pattern portion of the surface-processed substrate 180 in the ultraviolet light emitting device 100A shown in FIGS. 3 to 5.

Referring to FIG. 7, the substrate 180 includes a lower cut portion 180A and an upper cut portion 180B. The lower cut portion 180A has a horizontal cross-section surface which is the same shape as the lower surface 182 of the substrate 180. The upper cut portion 180B of the substrate 180 is disposed on the lower cut portion 180A and has a plurality of different horizontal cross-section surfaces present between an upper surface 186 of the lower cut portion 180A and the upper surface 184 of the substrate 180.

For example, as shown in FIGS. 5 to 7, a horizontal cross-sectional area of the lower surface 182 of the substrate 180 is larger than that of the upper surface 184 by cutting the total internal reflection regions 52, 54 and 56 shown in FIG. 6 from the substrate 180.

A side part of the upper cut portion 180B may have at least one inclined plane. Hereinafter, the inclined plane corresponds to the pattern portion which is surface-processed by cutting. All side parts of the upper cut portion 180B of the substrate 180 shown in FIGS. 3 to 7 have an inclined plane, but the disclosure is not limited thereto. Alternatively, only some of four side parts of the upper cut portion 180B may have an inclined plane.

Referring to FIG. 7, a width $b_2$ of the upper surface 184 of the substrate 180 and a width $b_1$ of the lower surface 182 may have a relation shown in the following Equation 2.

$$b_1 - b_2 = 2d \tan \Theta_1 \quad \text{Equation 2}$$

where 'd' represents a thickness of the upper cut portion 180B and $\Theta_1$ represents an inclination angle of an inclined plane. According to the process, the upper surface 184 may have a predetermined area, but the embodiment is not limited thereto. For example, the upper surface 184 has an area of 100 μm×100 μm.

When the substrate 180 is cut as described above, as shown in FIG. 3, the upper cut portion 180B of the substrate 180 may have a head-truncated pyramidal shape which is formed by cutting a vertex as a head portion from a pyramid.

Figure 8:
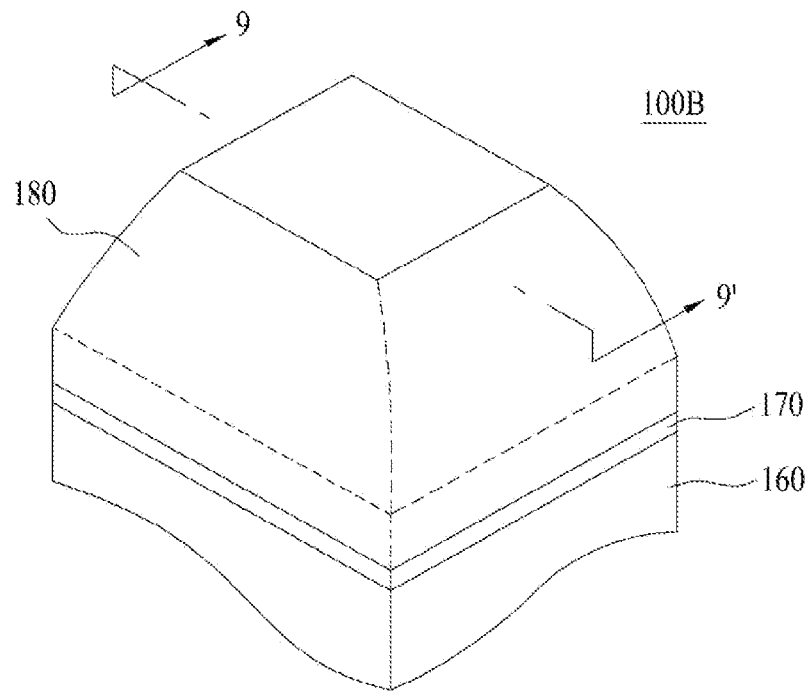
FIG. 8 is a perspective view illustrating an ultraviolet light emitting device according to another embodiment.
Figure 9:
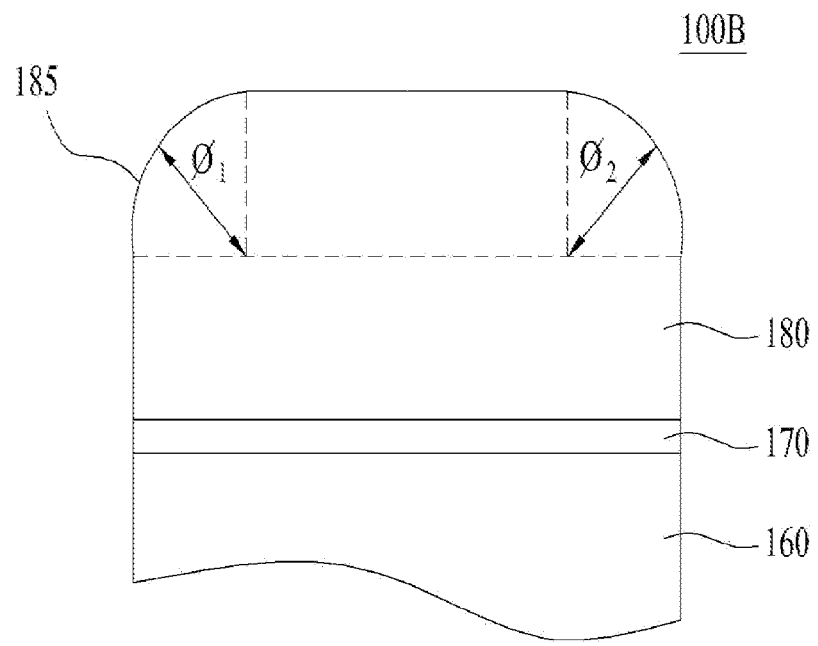
FIG. 9 is a sectional view taken along the line 9-9' of FIG. 8.

FIG. 8 is a perspective view illustrating an ultraviolet light emitting device 100B according to another embodiment. FIG. 9 is a sectional view taken along the line 9-9' of FIG. 8.

The inclined plane 183 of the side part of the upper cut portion 180B of the substrate 180 in FIG. 7 is flat, but the embodiment is not limited thereto. For example, the inclined plane 185 of the side part of the upper cut portion 180B of the substrate 180 may have convex curvatures φ1 and φ2, when seen from the outside, as shown in FIGS. 8 and 9. The curvatures φ1 and φ2 may be identical to or different from each other. Aside from this point, the ultraviolet light emitting device 100B shown in FIGS. 8 and 9 is the same as the ultraviolet light emitting device 100A shown in FIGS. 3 to 5 and 7, and a detailed explanation thereof is omitted.

Figure 10:
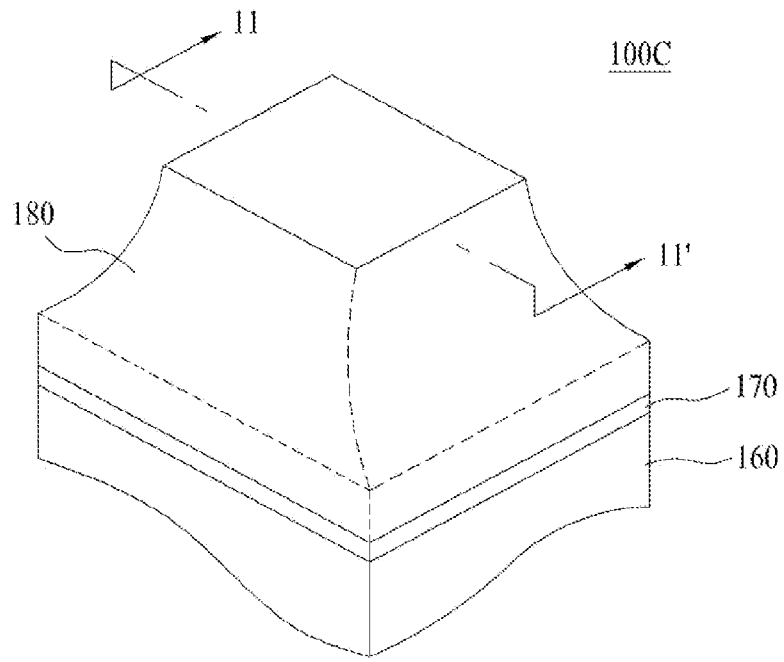
FIG. 10 is a perspective view illustrating an ultraviolet light emitting device according to still another embodiment.
Figure 11:
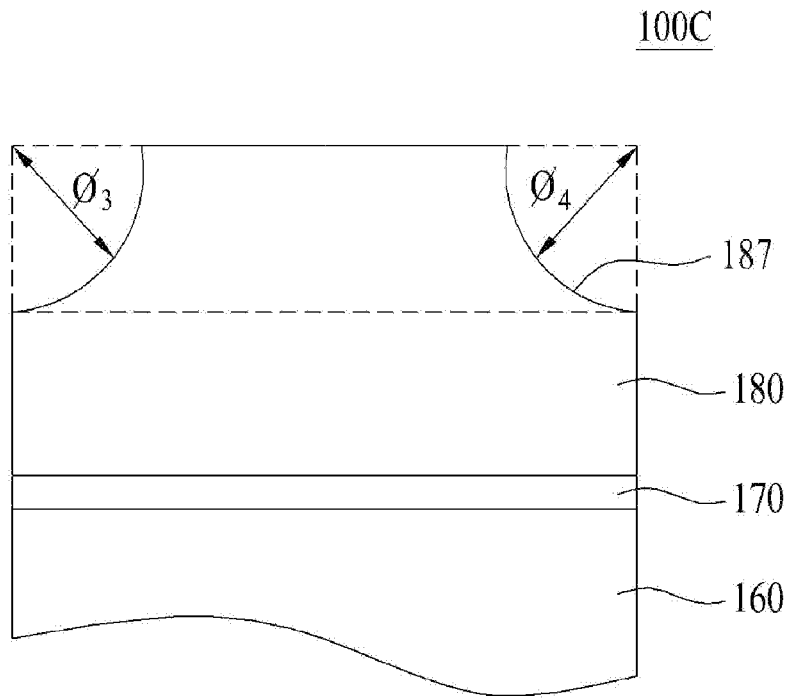
FIG. 11 is a sectional view taken along the line 11-11' of FIG. 10.

FIG. 10 is a perspective view illustrating an ultraviolet light emitting device 100C according to still another embodiment. FIG. 11 is a sectional view taken along the line 11-11' of FIG. 10.

In addition, the inclined plane 187 of the side part of the upper cut portion 180B of the substrate 180 may have concave curvatures φ3 and φ4, as shown in FIGS. 10 and 11, when seen from the outside. The curvatures φ3 and φ4 may be identical or different. Aside from this point, the ultraviolet light emitting device 100C shown in FIGS. 10 and 11 is the same as the ultraviolet light emitting device 100A shown in FIGS. 3 to 5 and 7, and a detailed explanation thereof is omitted.

Figure 12:
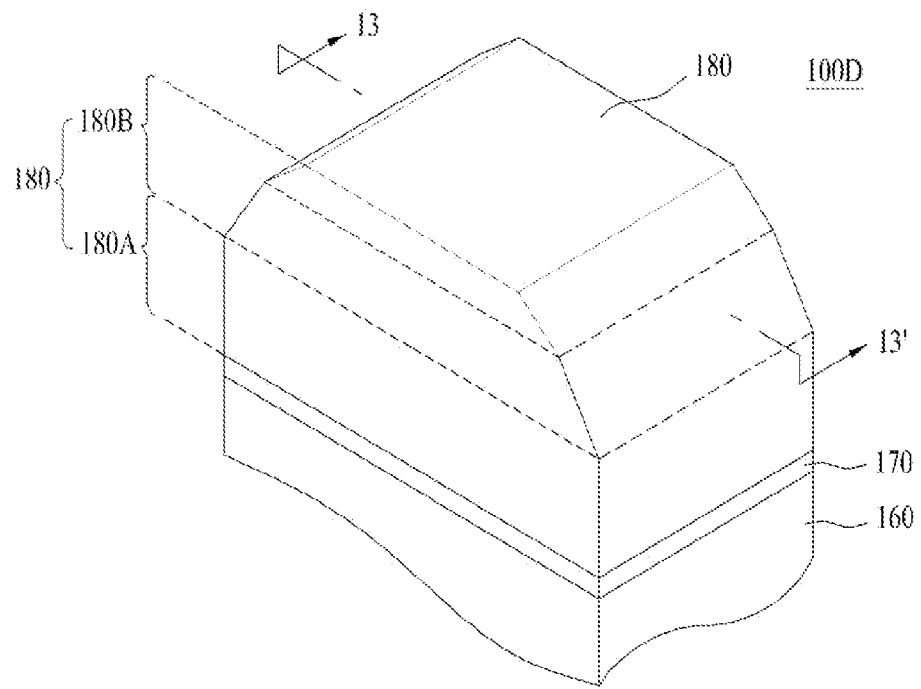
FIG. 12 is a perspective view illustrating an ultraviolet light emitting device according to still another embodiment.
Figure 13:
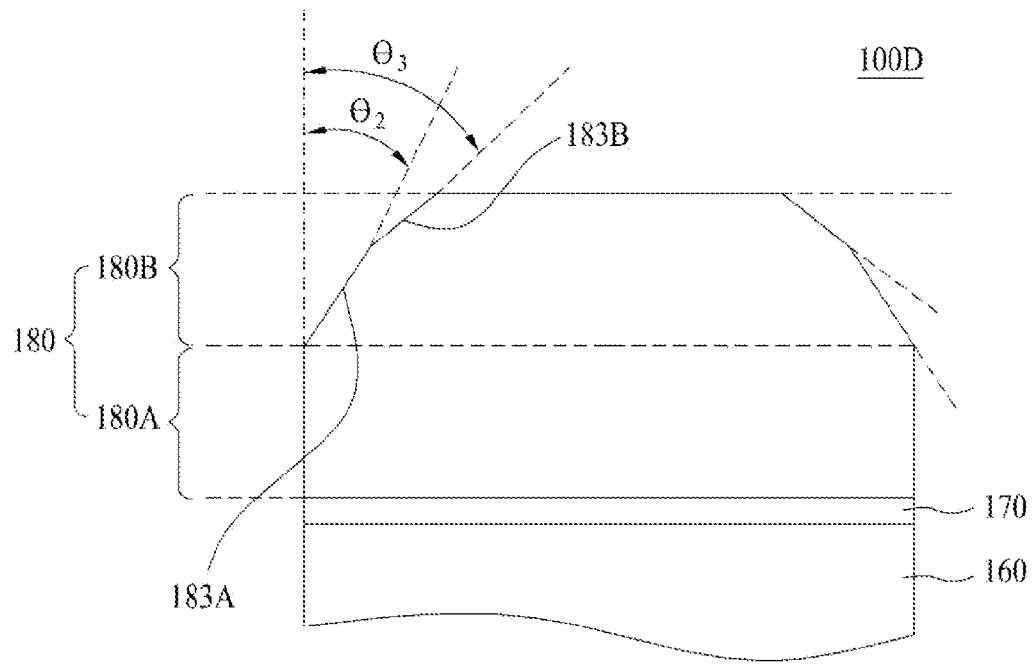
FIG. 13 is a partial sectional view taken along the line 13-13' of FIG. 12.

FIG. 12 is a perspective view illustrating an ultraviolet light emitting device 100D according to still another embodiment. FIG. 13 is a partial sectional view taken along the line 13-13' of FIG. 12.

In addition, when the inclined plane 183 of the upper cut portion 180B of the substrate 180 is inclined at one inclination angle $\Theta_1$, as shown in FIGS. 3 to 5 and 7, but the embodiment is not limited thereto. The inclined plane may be inclined at a plurality of inclination angles. For example, as shown in FIGS. 12 and 13, the inclined plane of the upper cut portion 180B may have inclined planes 183A and 183B inclined at two inclination angles $\Theta_2$ and $\Theta_3$, respectively. Aside from this point, the ultraviolet light emitting device 100D shown in FIGS. 12 and 13 is the same as the ultraviolet light emitting device 100A shown in FIGS. 3 to 5 and 7, and a detailed explanation thereof is omitted.

Figure 14A:
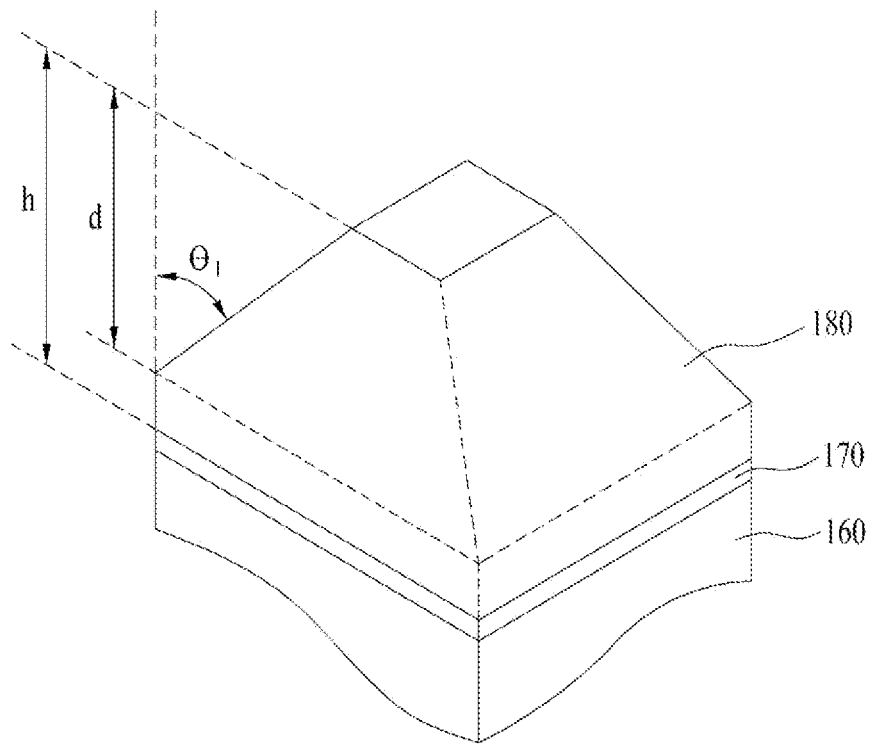
FIGS. 14A and 14B are perspective views illustrating ultraviolet light emitting devices having different configurations according to a thickness and an inclination angle of a lower cut portion of the substrate.
Figure 14B:
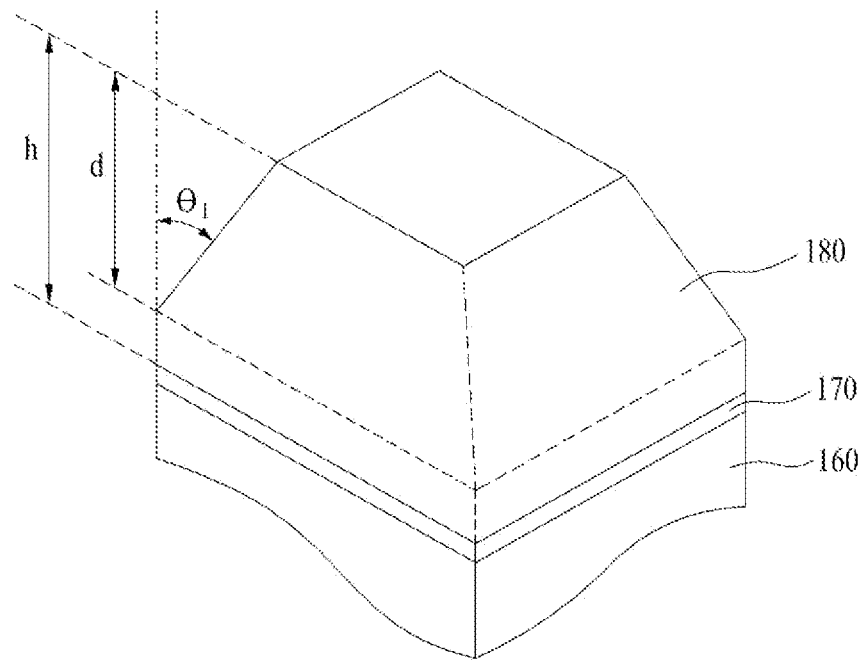

FIGS. 14A and 14B are perspective views illustrating ultraviolet light emitting devices having different configurations according to a thickness h-d and an inclination angle $\Theta_1$ of the lower cut portion 180A of the substrate 180.

FIG. 3 illustrates a configuration of the substrate 180, when the thickness h-d of the lower cut portion 180A of the substrate 180 is 100 μm and the inclination angle $\Theta_1$ is 40 degrees. FIG. 14A illustrates a configuration of the substrate 180, when the thickness h-d of the lower cut portion 180A of the substrate 180 is 50 μm and the inclination angle $\Theta_1$ is 40 degrees. FIG. 14B illustrates a configuration of the substrate 180 when the thickness h-d of the lower cut portion 180A of the substrate 180 is 50 μm and the inclination angle $\Theta_1$ is 20 degrees.

In the present embodiment, the thickness d of the substrate 180 is 100 μm to 130 μm, the width $b_1$ of the lower surface of the substrate 180 is 50 μm to 250 μm, the thickness h-d of the lower cut portion 180A is 25 μm to 100 μm, and the inclination angle $\Theta_1$ of the inclined plane is 30° to 40°.

Hereinafter, the thickness d of the substrate 180, the thickness h-d of the lower cut portion 180A and the inclination angle $\Theta_1$ of the inclined plane 183, for providing an optimum light extraction efficiency, will be described, when the ultraviolet light emitting device is realized as shown FIGS. 3 and 7. For this purpose, it is assumed that the substrate 180 is formed of sapphire, the buffer layer 170 is formed of AlN, and the first conductive type semiconductor layer 162 is formed of n-type AlGaN.

First, respective conditions of the active layer (MQW) 164, the n-type AlGaN layer 162, the AlN layer 170 and the sapphire substrate 180 are set forth in the following Table 3.

TABLE 3

| Types | Thickness | Index of Refraction (n) | T/(1 mm) | Notes |
|---|---|---|---|---|
| MQW | 0.5 μm | 2.56 | 10% | λ = 280 nm |
| N-type AlGaN | 1.5 μm | 2.5 | 79% | |
| AlN | 3 μm | 2.3 | 79% | |
| Sapphire substrate | Variable | 1.824 | 92% | |

In Table 3, 'T' means a transmittance level of light with respect to a boundary. Namely, the fact that the MQW has T of 10% means that a ratio of light which transmits the boundary between the MQW 164 and the n-type AlGaN layer 162 and is fed to the n-type AlGaN layer 162 is 10%. In addition, the fact that the n-type AlGaN layer 162 has a T of 79% means that a ratio of light which transmits the boundary between the n-type AlGaN layer 162 and the AlN layer 170 and is fed to the AlN layer 170 is 79%. In addition, the fact that the AlN layer 170 has a T of 79% means that a ratio of light which transmits the boundary between the AlN layer 170 and the sapphire substrate 180 and is fed to the sapphire substrate 180 is 79%. In addition, the fact that the sapphire substrate 180 has a T of 92% means that a ratio of light which transmits the boundary between the sapphire substrate 180 and air, and is fed to the air is 92%. For this, the light emitted from the active layer 164 is assumed to be 280 nm deep ultraviolet light.

The Johns Vectors as polarization conditions are shown in the following Equation 3.

$$\begin{pmatrix} 0.621 & 0.485 \\ 0.485 & 0.379 \end{pmatrix} \quad \text{Equation 3}$$

In addition, variable values are shown in the following Table 4.

TABLE 4

| Variables | | | | | | |
|---|---|---|---|---|---|---|
| Chip size = b1 (μm²) | Θ1 (°) | h (μm) | d (μm) | Lower boundary | Wavelength and polarization | Conclusions |
| 350 × 350 | 0 | 100, 200 | — | PML | λ = 280 nm | Conclusion 1 |
| 350 × 350 | 20, 30, 40 | 200 | 100, 150 | PML | FWHM = 10 nm | Conclusion 2 |

Here, PML in the lower boundary means perfect absorption boundary and corresponds to a lower part of the active layer 164. FWHM means full width at half maximum. In addition, in Table 4, 'Conclusion 1' and 'Conclusion 2' are conclusions obtained when tests are performed under the afore-mentioned conditions. 'Conclusion 1' is related to an effect of the thickness h of the sapphire substrate 180 on an amount of light and 'Conclusion 2' is related to an effect of the inclination angle Θ on an amount of light.

Figure 15:
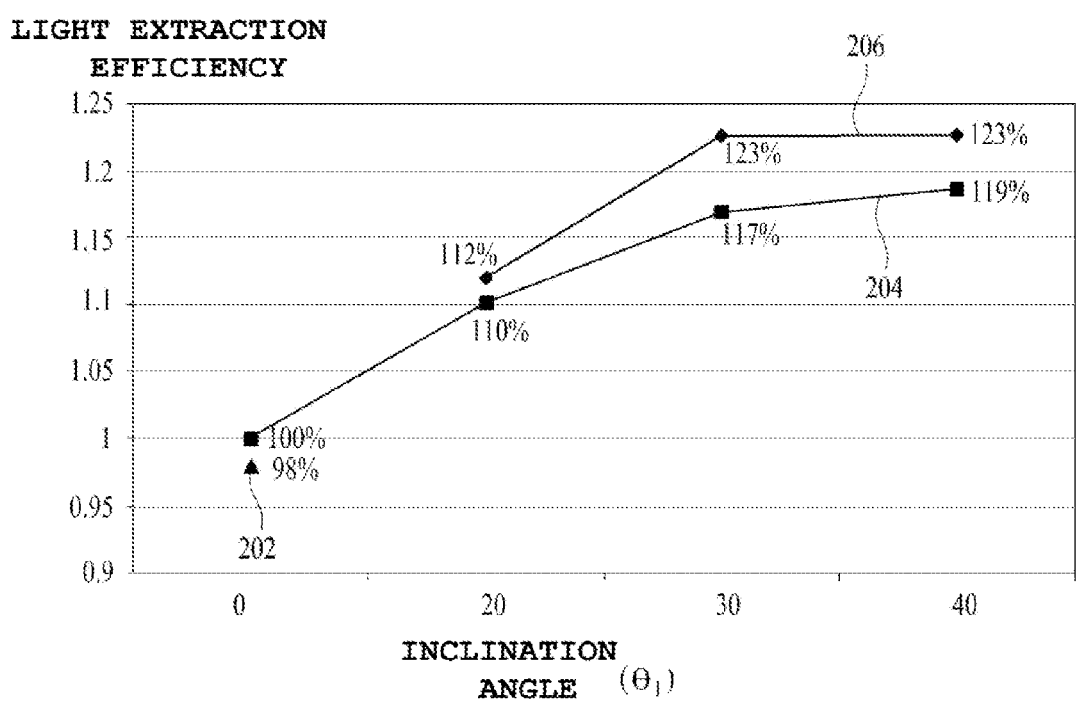
FIG. 15 is a graph showing light extraction efficiency according to the thickness and the inclination angle of the lower cut portion of the substrate.

FIG. 15 is a graph showing light extraction efficiency according to a thickness h-d and an inclination angle $\Theta_1$ of the lower cut portion 180A of the substrate 180.

Test results obtained under the afore-mentioned conditions are shown in FIG. 15. As can be seen from FIG. 15, a case 204, in which the thickness h of the substrate 180 is 200 μm and the thickness h-d of the lower cut portion 180A is 100 μm exhibits superior light extraction efficiency than a case 202 in which the thickness h of the substrate 180 is 100 μm and the thickness h-d of the lower cut portion 180A is 0 μm. In addition, a case 206 in which the thickness h of the substrate 180 is 200 μm and the thickness h-d of the lower cut portion 180A is 50 μm exhibits superior light extraction efficiency than the case 204, in which the thickness h of the substrate 180 is 200 μm and the thickness h-d of the lower cut portion 180A is 100 μm.

In addition, as can be seen from FIG. 15, when the thickness h-d of the lower cut portion 180A of the substrate 180 is 100 μm or 50 μm, as the inclination angle $\Theta_1$ increases, light extraction efficiency is improved. In these cases 204 and 206, when the inclination angle $\Theta_1$ is 30° to 40°, light extraction efficiency is slowed down. Accordingly, the inclination angle $\Theta_1$ may be determined within a range of 30° to 40°.

For example, the width $b_1$ of the lower surface of the substrate 180 is 100 μm, the thickness h-d of the lower cut portion 180A is 50 μm and a total thickness h of the substrate 180 is 200 μm.

Figure 16:
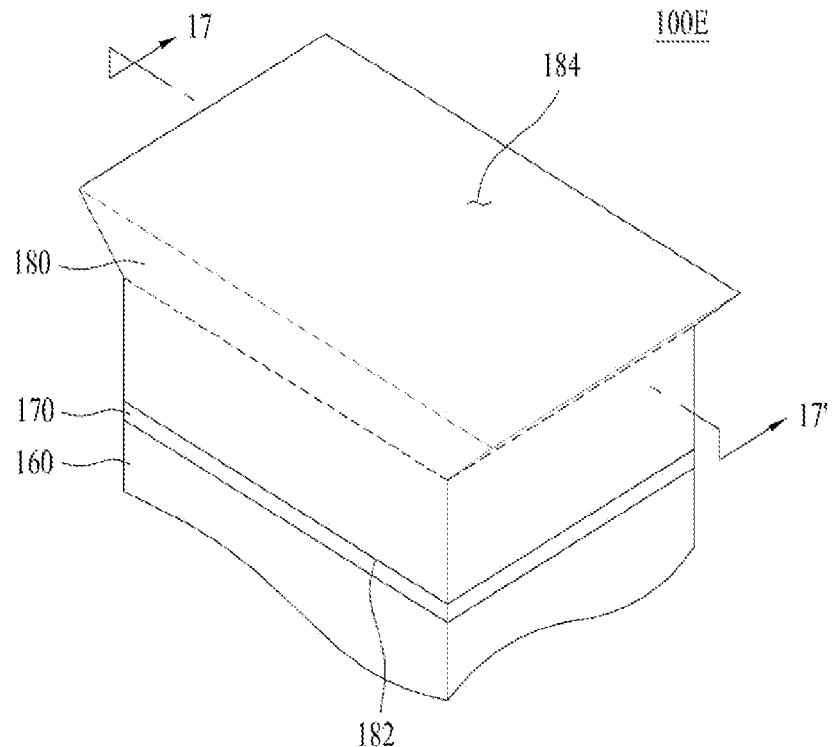
FIG. 16 is a perspective view illustrating an ultraviolet light emitting device according to still another embodiment.
Figure 17:
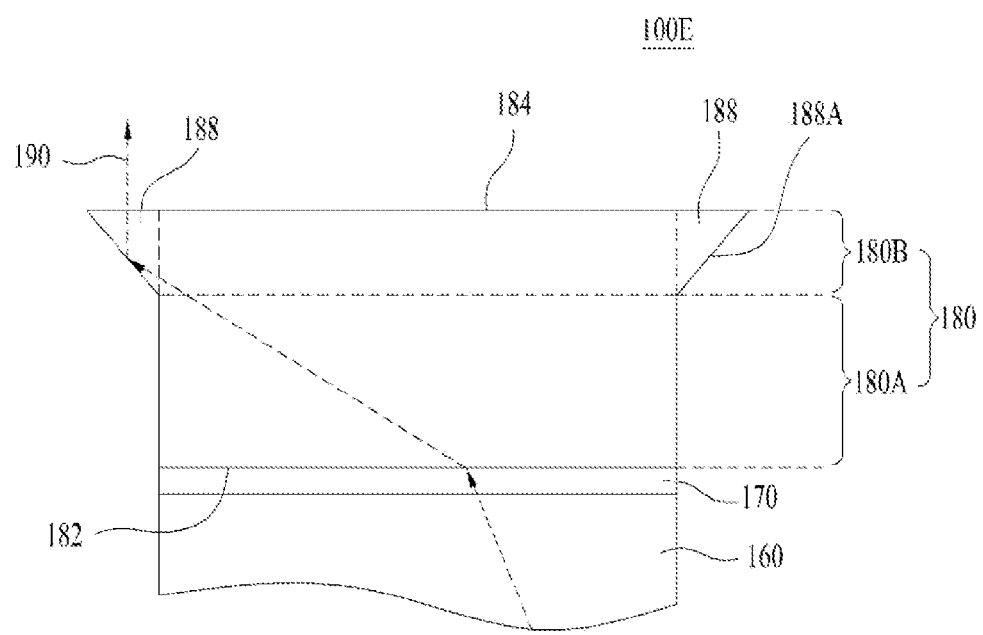
FIG. 17 is a sectional view taken along the line 17-17' of FIG. 16.

FIG. 16 is a perspective view illustrating an ultraviolet light emitting device 100E according to still another embodiment. FIG. 17 is a sectional view taken along the line 17-17' of FIG. 16.

According to the another embodiment, as shown in FIGS. 16 and 17, an area of the upper surface 184 of the substrate 180 may be larger than that of the lower surface 182. Referring to FIG. 17, the upper cut portion 180B of the substrate 180 includes at least one protrusion 188 at an edge thereof. Hereinafter, the protrusion (for example, 188) protruding from an edge of the upper cut portion 180B, the protrusion being formed by surface-processing at least one surface of upper and side parts of the substrate 180 by cutting, corresponds to the pattern portion. Here, the protrusion 188 may protrude in the total internal reflection regions 52, 54 and 56 shown in FIG. 6. In a case of FIG. 16, the protrusion 188 is provided on each of four edges in total, but the embodiment is not limited thereto. Alternatively, the protrusion 188 may be provided at only one or three of four edges in total. As shown in FIG. 17, the upper cut portion 180B of the substrate 180 may have a reverse head-truncated pyramidal shape which is formed by cutting a vertex as a head portion from a reverse pyramid. Aside from this point, the ultraviolet light emitting device 100E shown in FIGS. 16 and 17 is the same as the ultraviolet light emitting device 100A shown in FIGS. 3 to 5 and 7, and a detailed explanation thereof is omitted.

Figure 18:
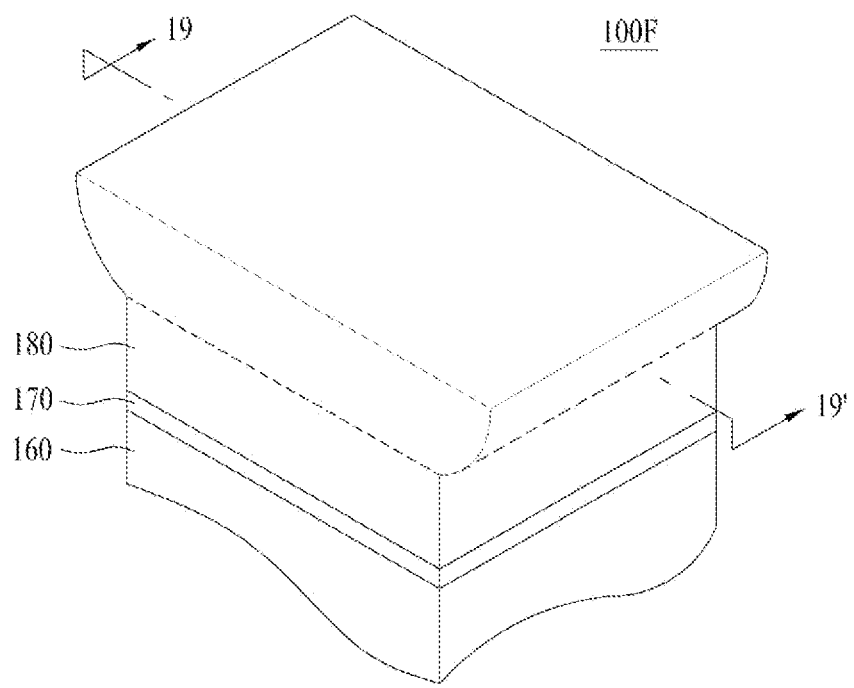
FIG. 18 is a perspective view illustrating an ultraviolet light emitting device 100F according to still another embodiment.
Figure 19:
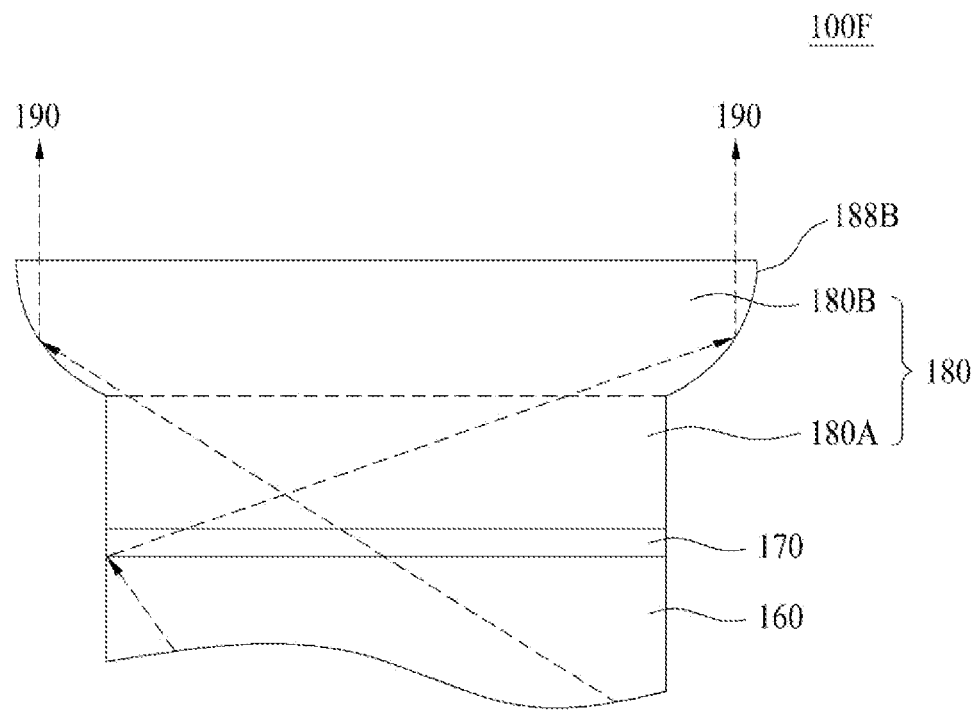
FIG. 19 is a partial sectional view taken along the line 19-19' of FIG. 18.

FIG. 18 is a perspective view illustrating an ultraviolet light emitting device 100F according to still another embodiment. FIG. 19 is a partial sectional view taken along the line 19-19' of FIG. 18.

A lower surface 188A of the protrusion 188 shown in FIGS. 16 and 17 is flat. On the other hand, the lower surface 188B of the protrusion 188 as shown in FIGS. 18 and 19 may have a convex curvature when seen from the outside. Aside from this point, the ultraviolet light emitting device 100F shown in FIGS. 18 and 19 is the same as the ultraviolet light emitting device 100E shown in FIGS. 16 and 17, and a detailed explanation thereof is omitted.

As shown in FIGS. 16 to 19, when an upper surface 184 of the upper cut portion 180B is wider than a lower surface 182 thereof, light 190 emitted from the light emitting structure 160 can be radiated upwardly. In view of the inherent properties of DUV light emitting devices, more light is emitted vertical to a C axis than in parallel to the C axis. In order to solve this phenomenon, as shown in FIGS. 16 to 19, the ultraviolet light emitting devices 100E and 100F are realized, to cause flatly emitting light to be total-reflected and be directed in the C axis direction and thereby improve light extraction efficiency.

Figure 20:
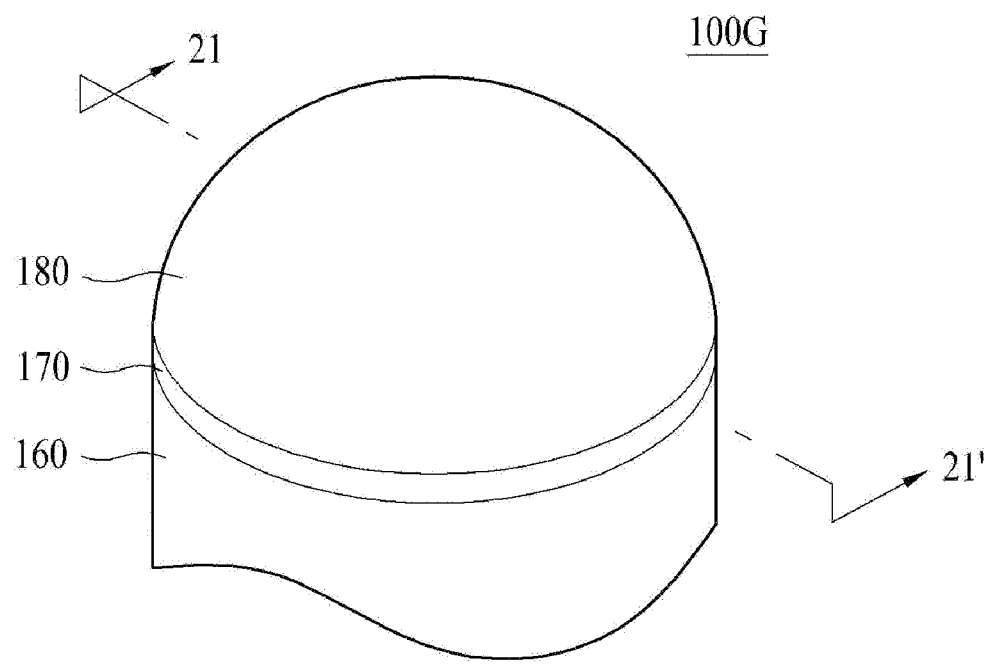
FIG. 20 is a perspective view illustrating an ultraviolet light emitting device according to still another embodiment.
Figure 21:
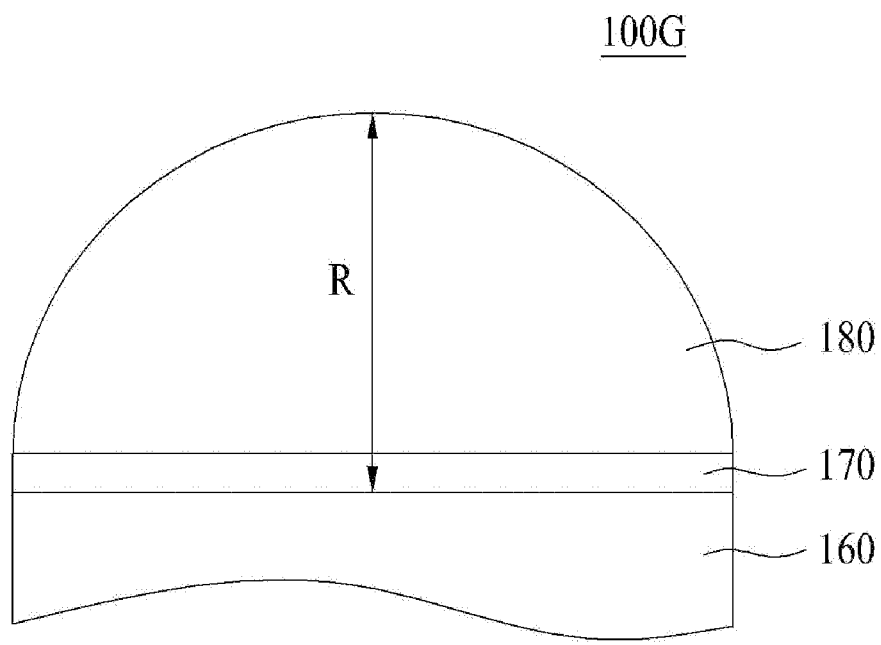
FIG. 21 is a sectional view taken along the line 21-21' of FIG. 20.

FIG. 20 is a perspective view illustrating an ultraviolet light emitting device 100G according to still another embodiment. FIG. 21 is a sectional view taken along the line 21-21' of FIG. 20.

According to the another embodiment, as shown in FIGS. 20 and 21, the substrate 180 of the ultraviolet light emitting device 100G may have a pattern portion surface-processed into a hemispherical shape (or dome shape).

In this case, the substrate 180 and the buffer layer 170 and/or light emitting structure 160 have an integrated hemispherical shape. Aside from this point, the ultraviolet light emitting device 100G shown in FIGS. 20 and 21 is the same as the ultraviolet light emitting device 100A shown in FIGS. 3 to 5 and 7, and a detailed explanation thereof is omitted.

A radius (R) of the hemisphere may be at least half a width b1 of the lower surface of the substrate 180. The radius (R) may be 200 μm to 500 μm, for example, 350 μm.

As shown in FIGS. 20 and 21, when the substrate 180 of the ultraviolet light emitting device 100G has a hemispherical shaped pattern portion, total reflection and diffused reflection of light are reduced, thereby increasing light extraction efficiency.

In addition, as described later, in order to increase light extraction efficiency of a light emitting device package, the light emitting device is generally covered with a molding member having a dome shape. However, as shown in FIGS. 20 and 21, when the substrate 180 of the ultraviolet light emitting device 100G is realized in a hemispherical shape, the molding member performing this function need not be formed. However, the molding member may be further disposed on the ultraviolet light emitting device 100G shown in FIGS. 20 and 21, so as to perform only a function of protecting the ultraviolet light emitting device.

Next, a pattern portion which is surface-processed so that the surface of at least one of side and upper parts of the substrate 180 has a random roughness according to a second embodiment will be described below.

Namely, the pattern portion of the afore-mentioned first embodiment has a shape which is surface-processed by cutting. However, in the second embodiment, the pattern portion may have a shape surface-processed to have a random roughness.

The pattern portion of the random roughness may be disposed in at least one of an upper part 184 of the substrate 180, and lower, intermediate and upper portions of the side part of the substrate 180. Hereinafter, an area of the substrate 180 on which the random roughness is present corresponds to the pattern portion.

Figure 22:
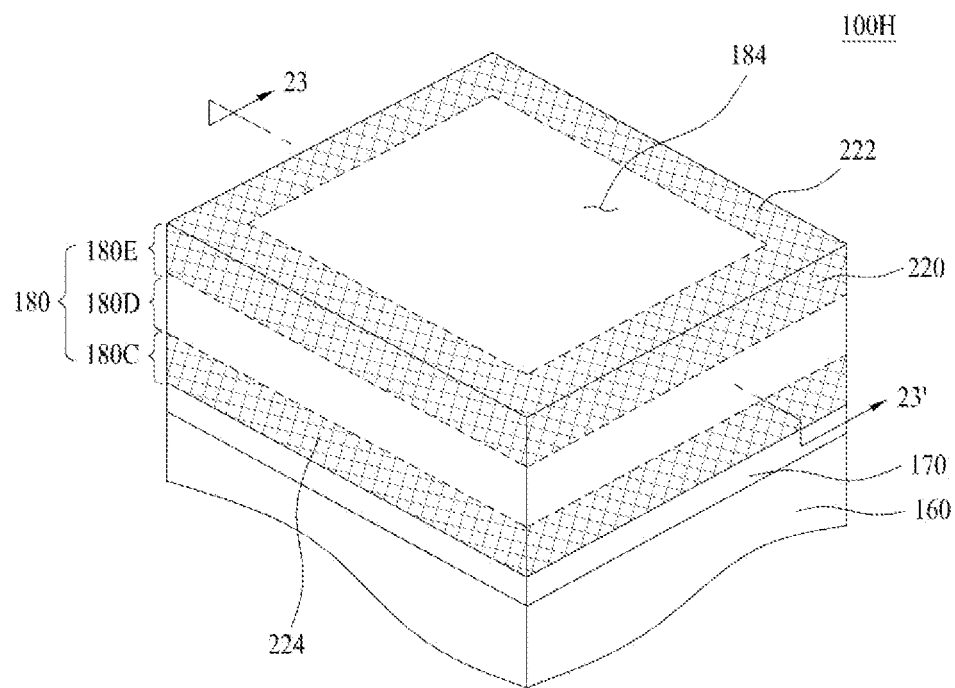
FIG. 22 is a perspective view illustrating an ultraviolet light emitting device according to still another embodiment.
Figure 23:
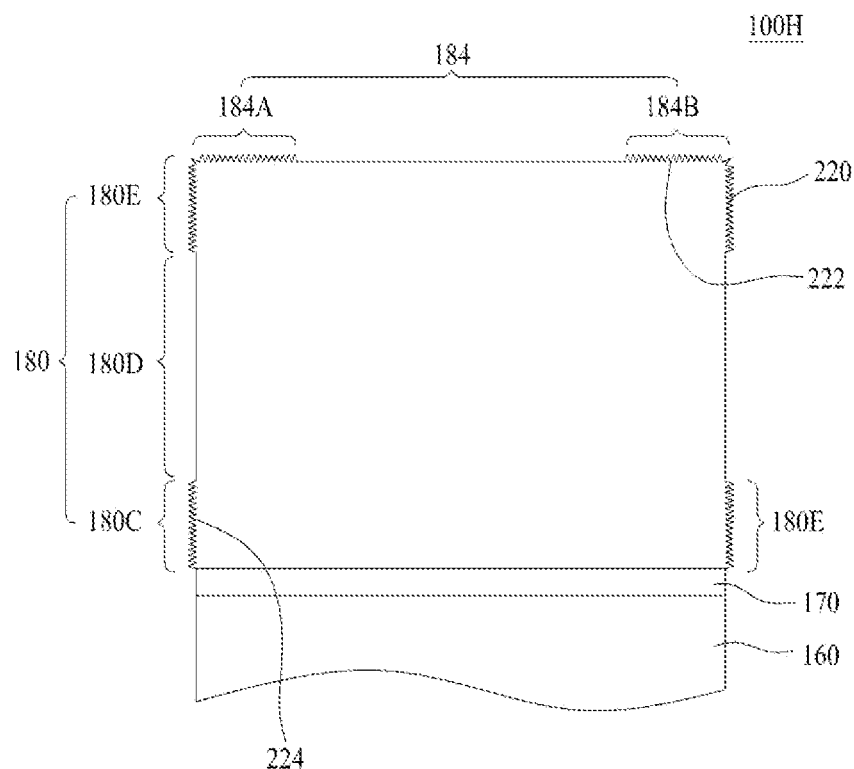
FIG. 23 is a sectional view taken along the line 23-23' of FIG. 22.

FIG. 22 is a perspective view illustrating an ultraviolet light emitting device 100H according to still another embodiment. FIG. 23 is a sectional view taken along the line 23-23' of FIG. 22.

In the case of the ultraviolet light emitting device 100H shown in FIGS. 22 and 23, pattern portions surface-processed by random roughnesses 220, 222 and 224 are disposed in an edge of the upper part 184 of the substrate 180, and a lower portion 180C and an upper portion 180E of the side part of the substrate 180. Here, the edge of the upper part 184 and the upper portion 180E of the side part may correspond to total internal reflection regions shown in FIG. 6. Aside from this point, the lower part of the substrate 180 of the ultraviolet light emitting device 100H shown in FIGS. 22 and 23 is the same as that of the ultraviolet light emitting device 100A shown in FIG. 3, and a detailed explanation thereof is omitted.

In the ultraviolet light emitting device 100H shown in FIGS. 22 and 23, the random roughness 220 is disposed in the upper portion 180E of the side part of the substrate 180, the random roughness 222 is disposed at upper edges 184A and 184B of the substrate 180, and the random roughness 224 is disposed in the lower portion 180C of the side part of the substrate 180, but the embodiment is not limited thereto. The random roughness may be disposed at various positions on the substrate 180.

Figure 24A:
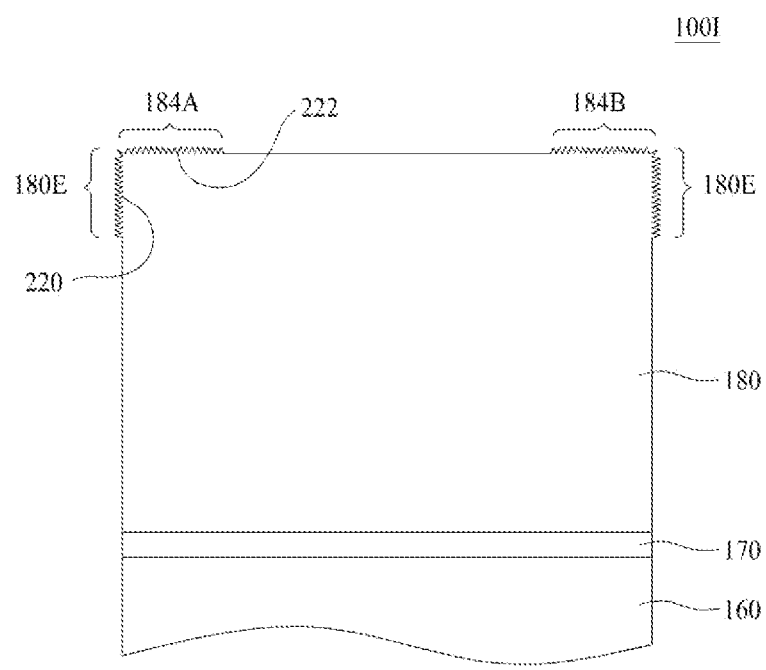
FIGS. 24A and 24B are sectional views illustrating ultraviolet light emitting devices according to still another embodiment.
Figure 24B:
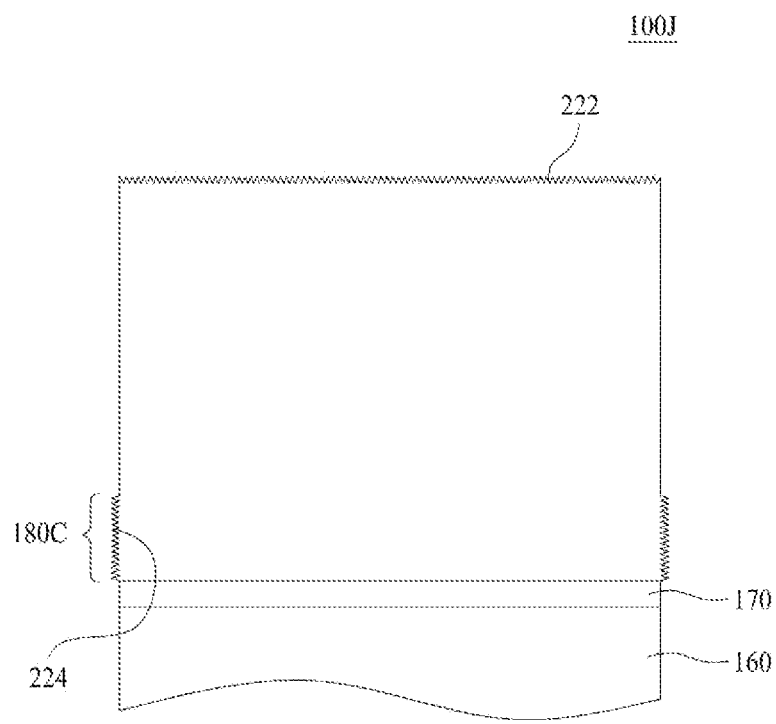

FIGS. 24A and 24B are sectional views illustrating ultraviolet light emitting devices 100I and 100J according to still another embodiment.

Unlike the illustration of FIGS. 22 and 23, the roughnesses 220 and 222 of the ultraviolet light emitting device 100I may be disposed only in the upper portion 180E of the side part of the substrate 180 and the upper edges 184A and 184B of the substrate 180, as shown in FIG. 24A. Alternatively, the roughnesses 222 and 224 in the ultraviolet light emitting device 100J may be disposed only in the entire upper part 184 of the substrate 180 and the lower portion 180C of the side part of the substrate 180, as shown in FIG. 24B. Alternatively, although not shown, the substrate 180 may be surface-processed such that the random roughness is formed in the entire side part (including 180C, 180D and 180E) of the substrate 180, and the substrate 180 may be surface-processed such that the random roughness is formed only in the upper edges 184A and 184B of the substrate 180 and the lower portion 180C of the side part.

As described in FIG. 1 above, the ultraviolet light emitting device, in particular, the deep ultraviolet light emitting device enables more light to escape to the side part of the substrate 180, as compared to a blue light emitting device. Accordingly, as shown in FIG. 22, 23 or 24B, when a random roughness is present in the lower portion 180c of the side part of the substrate 180, light is actively scattered and light extraction efficiency is further improved.

In the embodiment, a range of the lower portion 180C of the side part of the substrate 180, in which the random roughness is disposed, may be shown in the following Equation 4, $$0 < y < \frac{b_1}{2} \qquad \text{Equation 4}$$

where 'y' represents a position of the substrate 180 in a thickness direction of the substrate 180 and b1 represents a width of the lower surface of the substrate 180 based on the cartesian coordinate system shown in FIG. 6.

There are a variety of methods for surface-processing the substrate 180 so that the substrate 180 has a random roughness as a pattern portion. Of these, at least one of lapping and polishing may be used in order to form a random roughness of the upper surface 184 of the substrate 180. In this case, a roughness level may be controlled by a size of diamond slurry polishing particles used for lapping or polishing. The roughness level may be proportional to a polishing particle size. For example, the polishing particle size is 0.5 μm to 6 μm.

FIGS. 25A to 28B are images showing levels of random roughness according to polishing particle size. FIGS. 25A, 26A, 27A and 28A are images obtained by atomic force microscopy (AFM) and FIGS. 25B, 26B, 27B and 28B are images obtained by optical microscopy.

Referring to FIGS. 25A to 28B, long scratch shapes as formed by saw-toothed wheels passing over the surface of the substrate 180 correspond to random roughnesses.

Figure 25A:
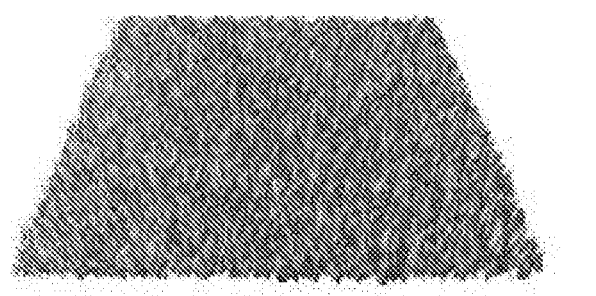
FIGS. 25A to 28B are images showing levels of random roughness according to polishing particle size.
Figure 25B:
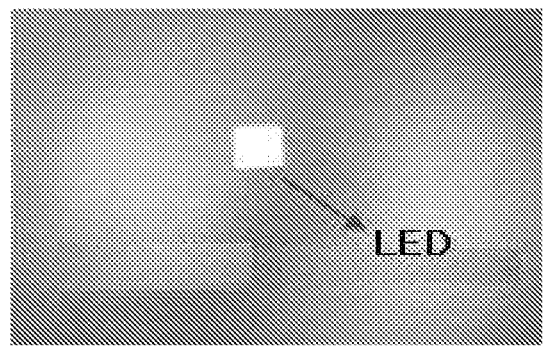

When the upper surface 184 of the substrate 180 is polished several times using different polishing particles, the random roughness of the upper surface 184 is low, as shown in FIGS. 25A and 25B.

Figure 26A:
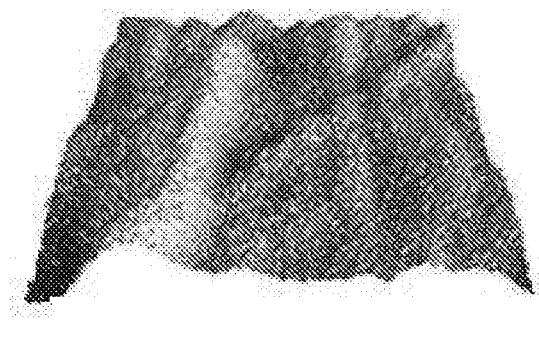
Figure 26B:
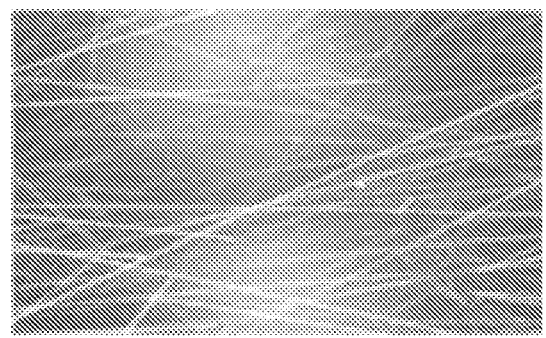

In addition, when the upper surface of the substrate 180 is polished using polishing particles having a size of 0.5 μm, a level of random roughness as shown in FIGS. 26A and 26B is higher than a level of random roughness as shown in FIGS. 25A and 25B.

Figure 27A:
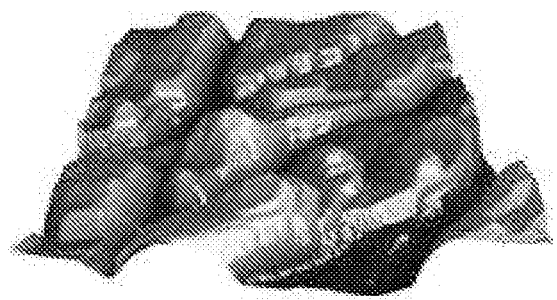
Figure 27B:
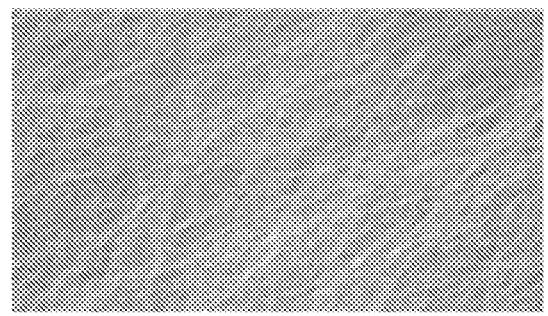

In addition, when the upper surface of the substrate 180 is polished using polishing particles having a size of 3 μm, a level of random roughness as shown in FIGS. 27A and 27B is higher than a level of random roughness as shown in FIGS. 26A and 26B.

Figure 28A:
Figure 28B:
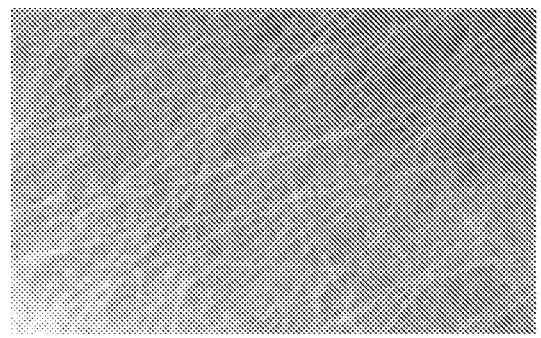
Figure 29A:
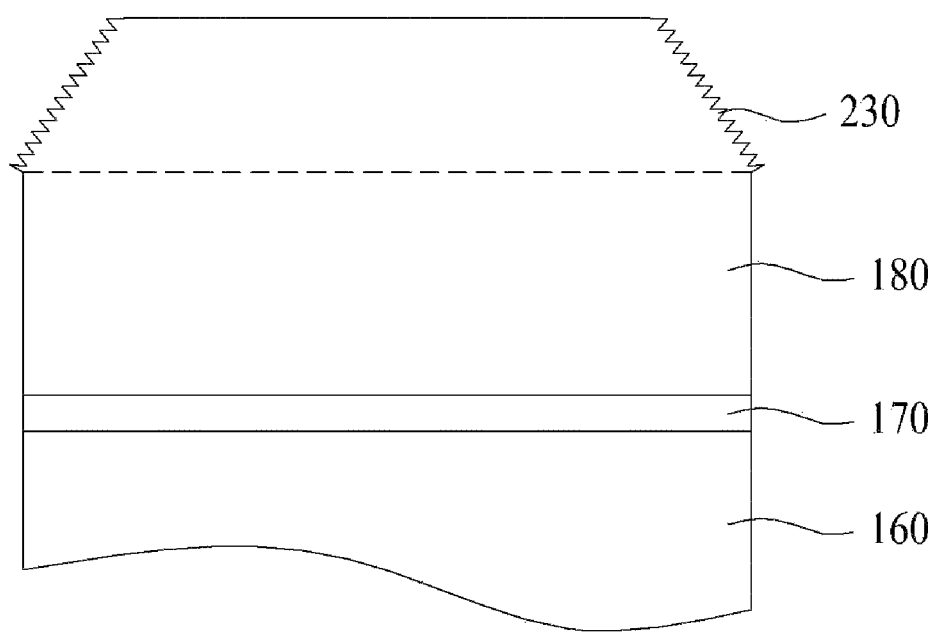
FIGS. 29A to 29G are sectional views illustrating a ultraviolet light emitting device according to still another embodiment.
Figure 29B:
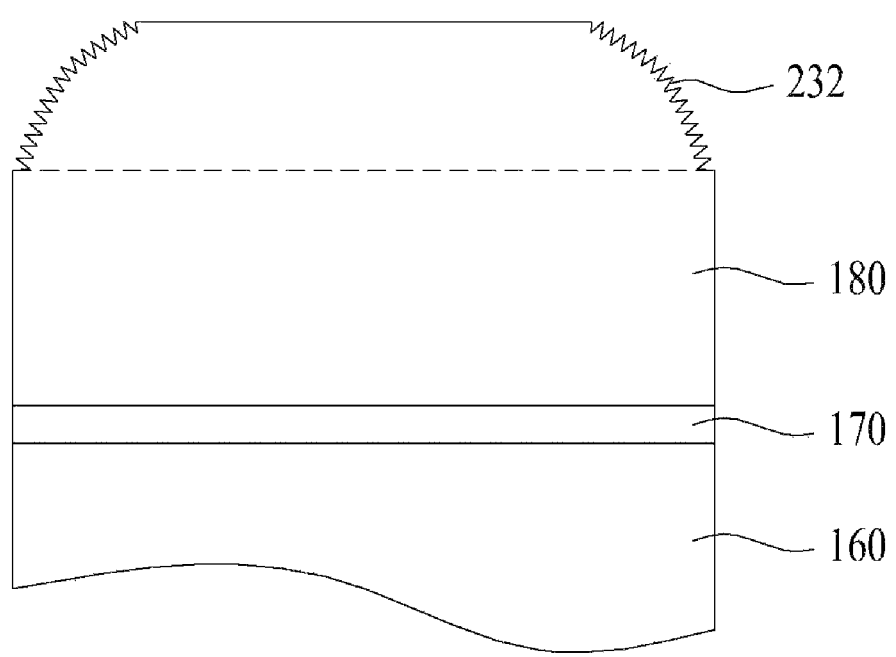
Figure 29C:
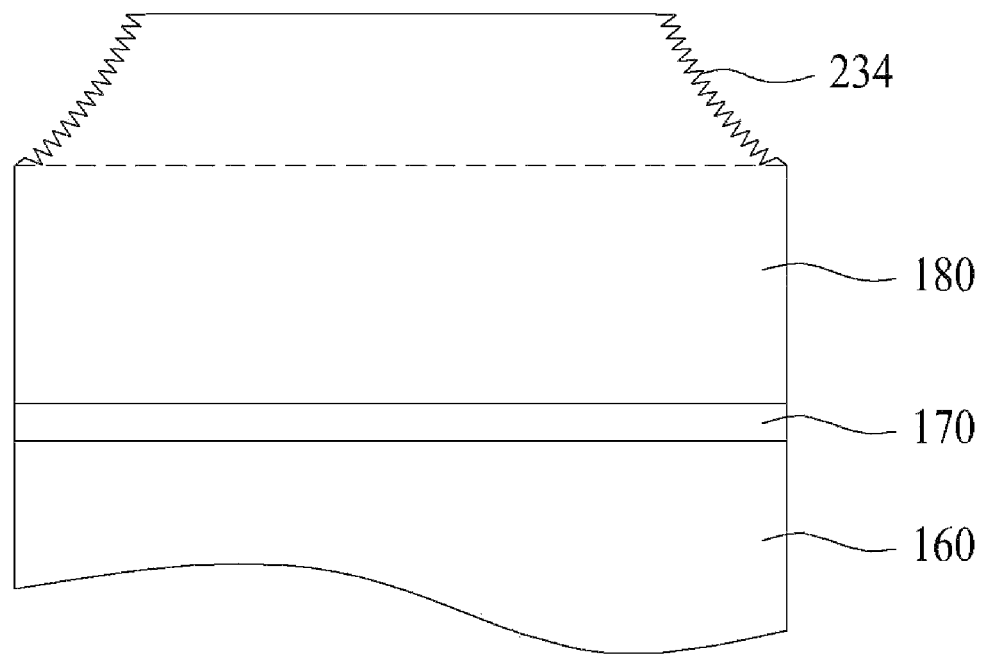
Figure 29D:
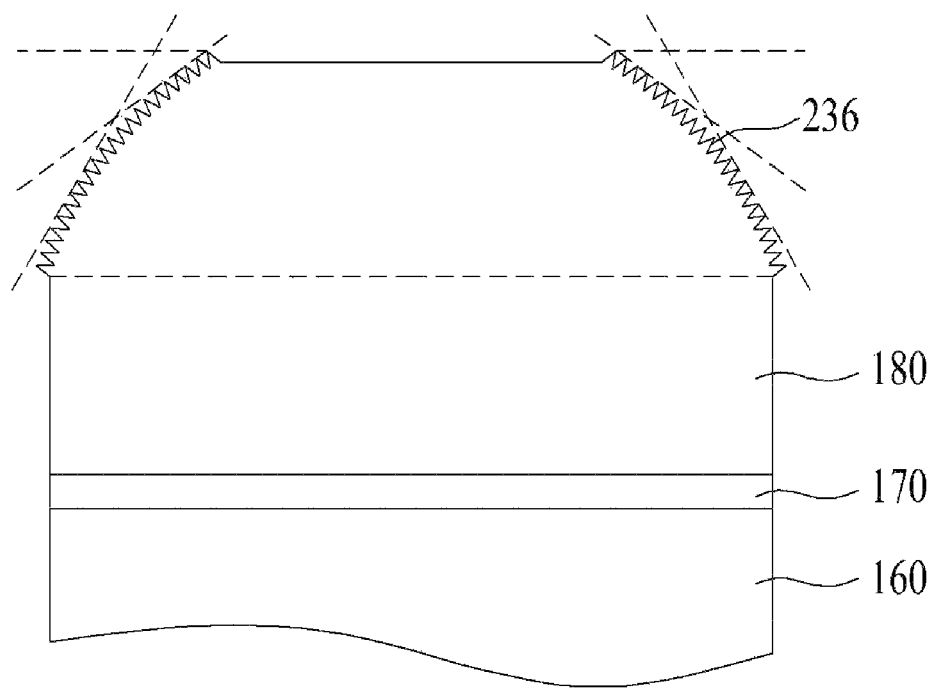
Figure 29E:
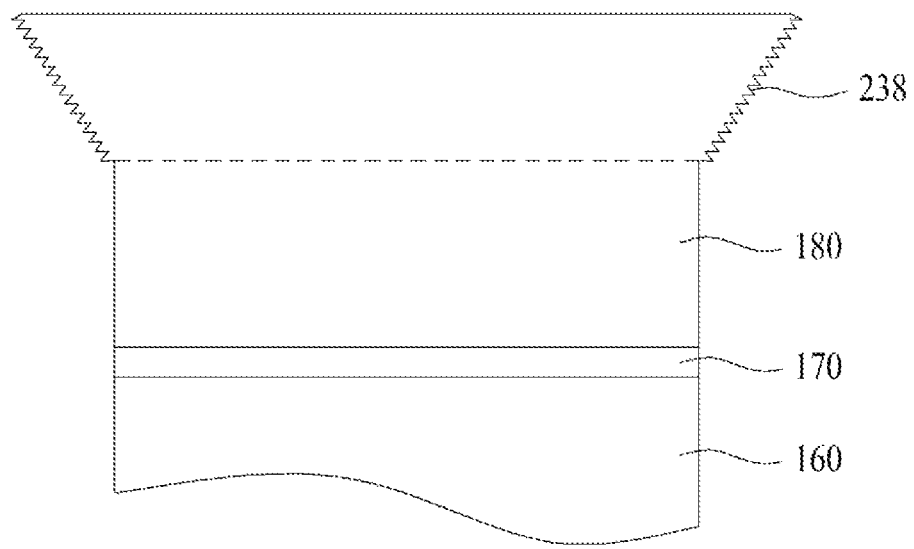
Figure 29F:
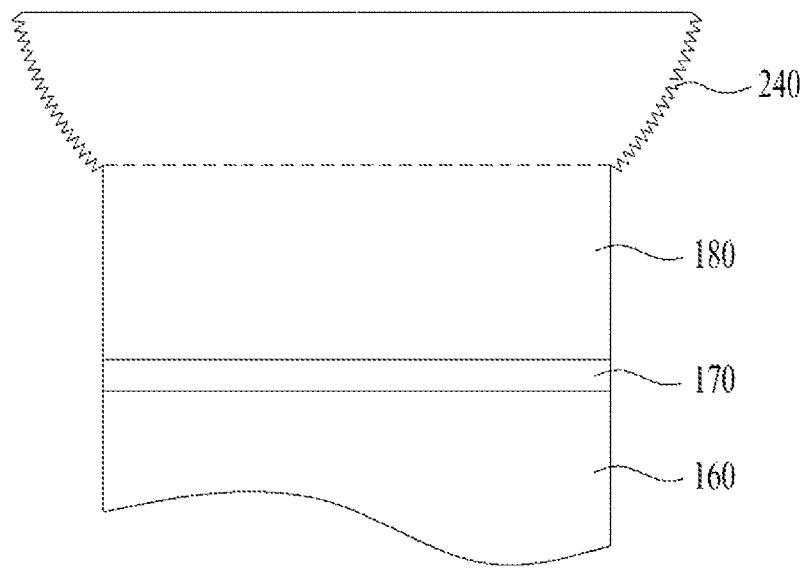
Figure 29G:
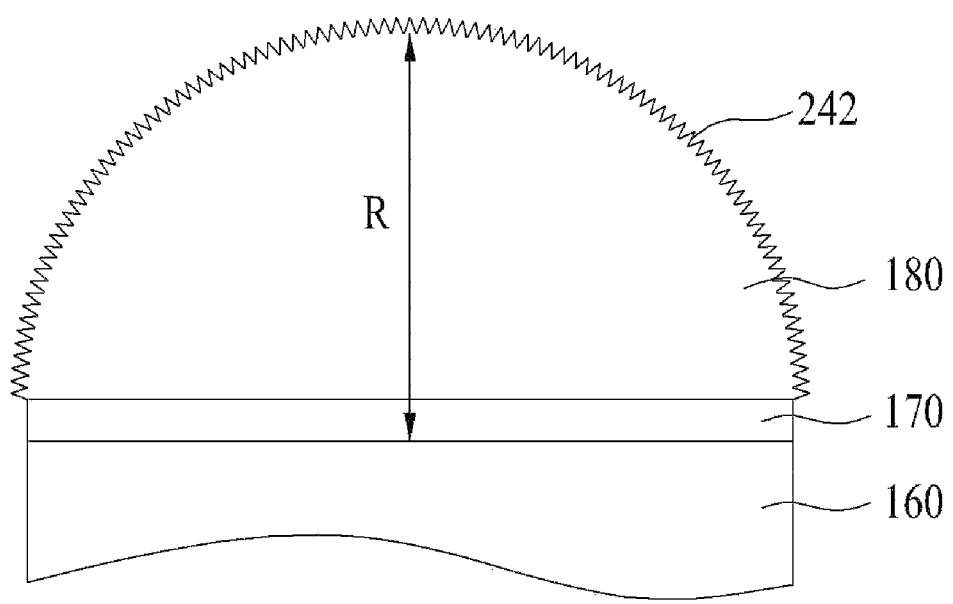

In addition, when the upper surface of the substrate 180 is polished using polishing particles having a size of 6 μm, a level of random roughness as shown in FIGS. 28A and 28B is higher than a level of random roughness as shown in FIGS. 27A and 27B.

As described above, as polishing particle size increases, a level of roughness increases. Characteristics of random roughness formed on the upper surface of the substrate 180 according to polishing particle size are shown in the following Table 5.

TABLE 5

|  | FIGS. 25A and 25B | FIGS. 26A and 26B | FIGS. 27A and 27B | FIGS. 28A and 28B |
| --- | --- | --- | --- | --- |
| ave | 0.0986 nm | 0.914 nm | 5.71 nm | 10.5 nm |
| rms | 0.125 nm | 1.10 nm | 7.36 nm | 13.6 nm |
| pv | 1.48 nm | 7.12 nm | 45.1 nm | 94.1 nm |

In Table 5, 'ave' represents an average width of random roughness, 'pv' (peak to valley) represents an index of a difference between the highest valley and the lowest valley among local and specific fine valleys of an optical surface, and 'rms' (root mean square) is a standard deviation of differences between high and low points measured over an entire region.

Alternatively, there is laser scribing as another surface-processing method for forming random roughness. In particular, laser scribing may be used to form random roughness in at least one of the lower portion 180C, the intermediate part 180D and the upper portion 180E of the side part of the substrate 180. For example, a stealth laser is used to form roughness. In this case, light extraction efficiency is improved during multiple processing according to focus depth. Furthermore, a nano-second pulse laser or a pico-second pulse laser may be used to form roughness. The pico-second pulse laser causes less thermal damage, as compared to the nano-second pulse laser, thus exhibiting superior light extraction efficiency.

As another method for forming random roughness, wet etching using a mixed solution of phosphoric acid (H2PO3) and sulfuric acid (H2SO4) may be used.

Alternatively, as still another surface-processing method for forming random roughness, dry etching such as inductively coupled plasma-reactive ion etching (ICP-RIE) may be used.

A roughness level and roughness randomness may be determined according to selection of the afore-mentioned surface-processing methods.

Scattering of light on nanoparticles causes creation of different deep and active colors, and in particular, in a case in which surface plasma resonance is involved. Rayleigh scattering means a process in which small volumes of spheres associated with different refraction indexes such as particle bubbles, small water bubbles, or uniform density are scattered by electromagnetic radiation including light. In accordance with the model of Rayleigh, the spheres should be much smaller in diameter than the wavelength of the scattered light. Typically, the upper limit is taken to be about 1/10 of wavelength. In this size regime, the exact shape of the scattering center is usually not very significant and can often be treated as a sphere of equivalent volume. The inherent scattering that radiation undergoes passing through a pure gas is due to microscopic density fluctuations as the gas molecules move around, which are normally small enough in scale for Rayleigh's model to apply. The shorter blue wavelengths are more strongly scattered than the longer red wavelengths according to Rayleigh's famous $1/\lambda 4$ relation. Accordingly, the roughness randomness and the roughness level of the substrate 180 affect scattering of light. In an ultraviolet light emitting device, Rayleigh scattering exhibits much more luminous efficacy at $1/\lambda 4$.

In addition, according to the third embodiment, the pattern portion may have the inclined plane of the substrate 180 shown in FIGS. 3 to 5, and 7 to 21 as well as random roughness formed on the surface of the inclined plane.

FIGS. 29A to 29G are sectional views illustrating ultraviolet light emitting devices 100K to 100Q according to still another embodiment.

As can be seen from FIGS. 29A to 29G, random roughnesses 230 to 242 are formed on the inclined plane. Accordingly, through the respective random roughnesses 230 to 242, more active scattering is possible on the inclined plane, more light escapes from the substrate 180, thereby improving light extraction efficiency.

FIGS. 29A, 29B, 29C, 29D, 29E, 29F and 29G correspond to FIGS. 7, 9, 11, 13, 17, 19 and 21, respectively, except that the random roughnesses 230 to 242 are formed, and a detailed explanation thereof is thus omitted.

Figure 30:
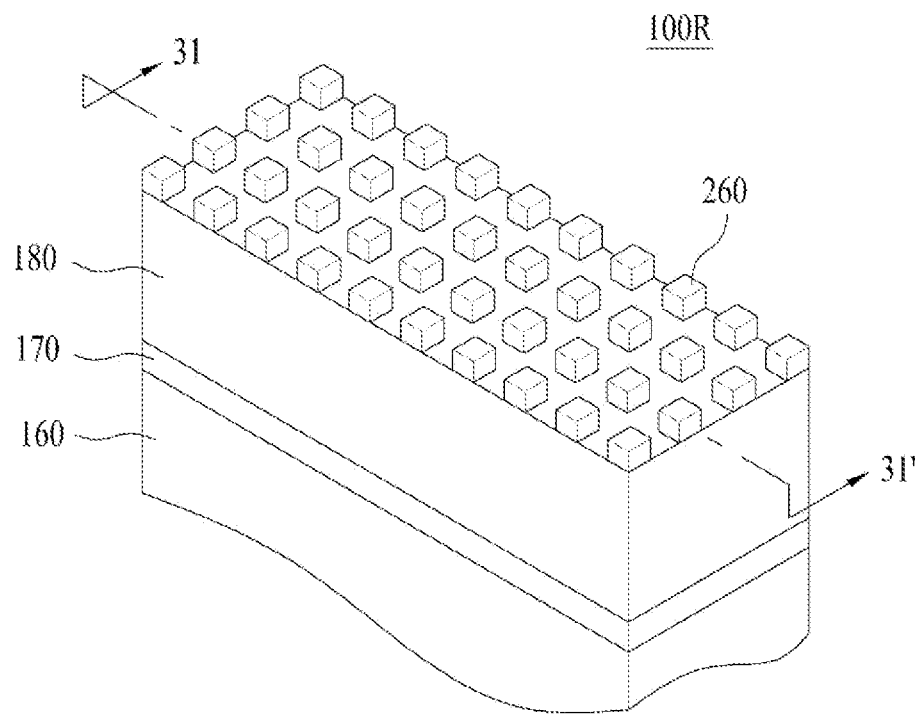
FIG. 30 is a perspective view illustrating an ultraviolet light emitting device according to still another embodiment.
Figure 31:
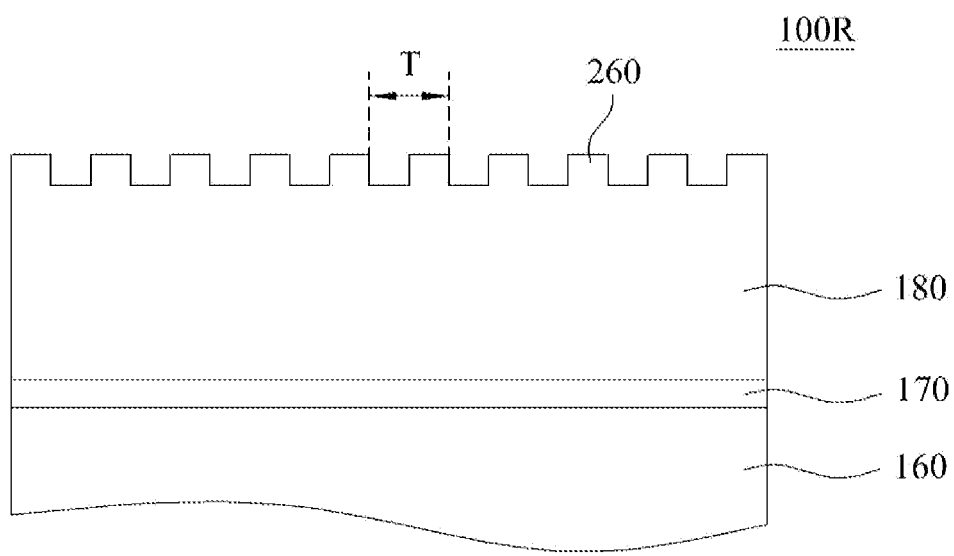
FIG. 31 is a sectional view taken along the line 31-31' of FIG. 30.

FIG. 30 is a perspective view illustrating an ultraviolet light emitting device 100R according to still another embodiment. FIG. 31 is a sectional view taken along the line 31-31' of FIG. 30.

Referring to FIGS. 30 and 31, the ultraviolet light emitting device 100R according to the embodiment may have a pattern portion having irregularities 260 on the upper surface of the substrate 180. The irregularities are similar to a common photonic crystal structure and a detailed explanation thereof is thus omitted. The ultraviolet light emitting devices 100A to 100G shown in FIGS. 3 to 21 have an inclined plane, the ultraviolet light emitting devices 100H to 100J shown in FIGS. 22 to 23b have a random roughness, the ultraviolet light emitting devices 100K to 100Q shown in FIGS. 29A to 29G have an inclined plane and a random roughness as pattern portions, while the ultraviolet light emitting device 100R shown in FIGS. 30 and 31 has irregularities as a pattern portion. Aside from this point, the ultraviolet light emitting device 100R shown in FIGS. 30 and 31 is the same as the ultraviolet light emitting device 100A shown in FIGS. 3 to 7 and a detailed explanation thereof is thus omitted.

The irregularities 260 shown in FIGS. 30 and 31 may be periodically or non-periodically (randomly) arranged and be arranged at a plurality of different periods. When the irregularities 260 are periodically arranged, a period (T) is $\lambda/4$, wherein $\lambda$ is a wavelength of light emitted from the active layer 164. The period T is 20 nm to 120 nm for example, 70 nm.

Similar to the function of the general photonic crystal structure, the substrate 180 has the irregularities 260 as the pattern portion on the upper surface thereof, thus enabling more light to escape from the upper part of the substrate 180 and thereby improving light extraction efficiency.

<Vertical-Type Ultraviolet Light Emitting Device>

Hereinbefore, the ultraviolet light emitting device according to the present embodiment in which the light-transmitting layer is bonded to the active layer by a flip method, has been described. However, the light-transmitting layer and the active layer according to the present embodiment may be applied to a vertical-type ultraviolet light emitting device.

Hereinafter, the vertical-type ultraviolet light emitting device according to the present embodiment will be described with reference to the annexed drawings.

Figure 32:
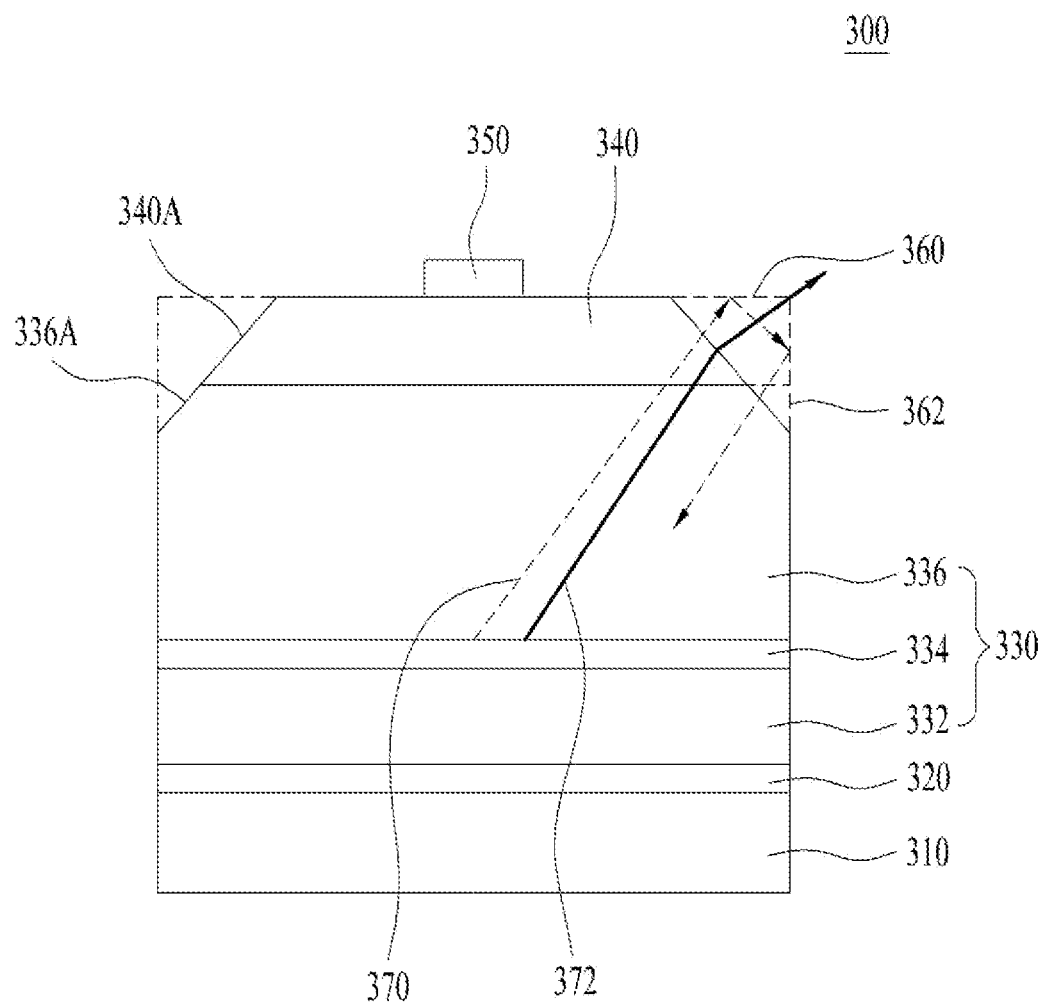
FIG. 32 is a sectional view illustrating a vertical-type ultraviolet light emitting device according to still another embodiment.

FIG. 32 is a sectional view illustrating a vertical-type ultraviolet light emitting device 300 according to still another embodiment.

The vertical-type ultraviolet light emitting device 300 shown in FIG. 32 includes a support substrate 310, a first conductive type electrode layer 320, a light emitting structure 330, a second conductive type electrode layer 340, and a second electrode pad 350.

The support substrate 310 shown in FIG. 32 is a conductive type material selected from the group consisting of molybdenum (Mo), silicon (Si), tungsten (W), copper (Cu) and aluminum (Al), or an alloy thereof. In addition, the support substrate 310 may optionally contain, for example, gold (Au), copper alloy (Cu Alloy), nickel (Ni-nickel), copper-tungsten (Cu—W), or a carrier wafer (e.g., GaN, Si, Ge, GaAs, ZnO, SiGe, SiC, SiGe, or Ga2O3). Formation of the support substrate 310 in a conductive type may be carried out using electrochemical metal deposition or bonding using a eutectic metal.

In addition, the first conductive type electrode layer 320 is disposed on the support substrate 310. The first conductive type electrode layer 320 may include a reflective layer (not shown) and an ohmic layer (not shown).

The reflective layer is disposed on the support substrate 310 and includes one or more layers comprising a material selected from Ag, Ni, Al, Rh, Pd, Ir, Ru, Mg, Zn, Pt, Au, and Hf, or an alloy of two or more thereof. For example, the reflective layer such as aluminum or silver may effectively reflect light emitted from the active layer 334 and greatly improve light extraction efficiency of the ultraviolet light emitting device.

In addition, the ohmic layer may include one or more layers comprising a material selected from a metal, for example, Ag, Ni, Cr, Ti, Al, Rh, Pd, Ir, Sn, In, Ru, Mg, Zn, Pt, Au, and Hf and an alloy of two or more thereof, but the disclosure is not limited to these materials.

In addition, the first conductive type electrode layer 320 may include one or more layers functioning as both a reflective layer and an ohmic layer, but the disclosure is not limited thereto.

When the support substrate 310 functions as the first conductive type electrode layer 320, the first conductive type electrode layer 320 need not be formed.

In addition, an adhesive layer (not shown) may be further disposed between the support substrate 310 and the first conductive type electrode layer 320. The adhesive layer is formed of, for example, a material selected from the group consisting of gold (Au), tin (Sn), indium (In), silver (Ag), nickel (Ni), niobium (Nb) and copper (Cu), or an alloy thereof.

Meanwhile, the light emitting structure 330 includes a first conductive type semiconductor layer 332, an active layer 334 and a second conductive type semiconductor layer 336.

The first conductive type semiconductor layer 332 is disposed on the first conductive type electrode layer 320 and is formed of a semiconductor compound. The first conductive type semiconductor layer 332 may be realized with a Group III-V or Group II-VI compound semiconductor and be doped with a first conductive type dopant. For example, the first conductive type semiconductor layer 332 may be formed of a semiconductor material having a compositional formula of $Al_xIn_yGa_{1-x-y}N$ ($0 \leq x \leq 1$, $0 \leq y \leq 1$, $0 \leq x+y \leq 1$) or InAlGaN. When the first conductive type semiconductor layer 332 is a p-type semiconductor layer, the first conductive type dopant may be a p-type dopant such as Mg, Zn, Ca, Sr or Ba. The first conductive type semiconductor layer 332 may have a monolayer or multilayer structure, but the disclosure is not limited thereto.

The active layer 334 may be disposed between the first conductive type semiconductor layer 332 and the second conductive type semiconductor layer 336 and may have a single well structure, double heterostructure, a multiple well structure, a single quantum well structure, a multi quantum well (MQW) structure, a quantum dot structure or a quantum wire structure. The active layer 334 may be formed to have a pair structure including a well layer and a barrier layer using a Group III-V compound semiconductor material, for example, at least one of InGaN/GaN, InGaN/InGaN, GaN/AlGaN, InAlGaN/GaN, GaAs(InGaAs)/AlGaAs, and GaP (InGaP)/AlGaP, but the disclosure is not limited thereto. The well layer may be formed of a material having a narrower energy band gap than an energy band gap of the barrier layer. In particular, the active layer 334 according to one embodiment may emit ultraviolet light having a wavelength band of 200 nm to 405 nm, in particular, deep ultraviolet light having a wavelength band of 200 nm to 350 nm.

A conductive type clad layer (not shown) may be formed between the active layer 334 and the first conductive type semiconductor layer 332 or between the active layer 334 and the second conductive type semiconductor layer 336.

The conductive type clad layer may be formed of a semiconductor having a wider band gap than a band gap of the barrier layer of the active layer 334. For example, the conductive type clad layer may have a GaN, AlGaN, InAlGaN, superlattice structure or the like. In addition, the conductive type clad layer may be doped with an n-type or p-type dopant.

The second conductive type semiconductor layer 336 may be disposed under the active layer 334 and be formed of a semiconductor compound. The second conductive type semiconductor layer 336 may be realized with a Group III-V or Group II-VI compound semiconductor and be doped with a second conductive type dopant. For example, the second conductive type semiconductor layer 336 may be formed of a semiconductor material having a compositional formula of $In_xAl_yGa_{1-x-y}N$ ($0 \leq x \leq 1$, $0 \leq y \leq 1$, $0 \leq x+y \leq 1$) or InAlGaN. When the second conductive type semiconductor layer 336 is an n-type semiconductor layer, the second conductive type dopant may be an n-type dopant such as Si, Ge, Sn, Se or Te. The second conductive type semiconductor layer 336 may have a monolayer or multilayer structure, but the disclosure is not limited thereto.

In addition, the second conductive type electrode layer 340 is disposed on the second conductive type semiconductor layer 336. The second conductive type electrode layer 340 is formed of, for example, a metal selected from molybdenum (Mo), chromium (Cr), nickel (Ni), gold (Au), aluminum (Al), titanium (Ti), platinum (Pt), vanadium (V), tungsten (W), lead (Pd), copper (Cu), rhodium (Rh) and iridium (Ir), or an alloy thereof and has a monolayer or multilayer structure.

The second electrode pad 350 may be disposed on the second conductive type electrode layer 340. In addition, a first electrode pad (not shown) may be disposed under the support substrate 310.

Meanwhile, according to the embodiment, at least one of upper and side parts of the second conductive type semiconductor layer 336 and the second conductive type electrode layer 340 has at least one surface-processed pattern portion. Namely, the substrate 180 shown in FIGS. 3 to 29G corresponds to a light-transmitting layer, while the second conductive type semiconductor layer 336 and the second conductive type electrode layer 340 in the ultraviolet light emitting device 300 shown in FIG. 32 correspond to the light-transmitting layers. When the second conductive type electrode layer 340 is omitted from the vertical-type ultraviolet light emitting device 300, the second conductive type semiconductor layer 336 corresponds to the light-transmitting layer.

Accordingly, like that the substrate 180 is surface-processed by cutting at least one of upper and side parts of the substrate 180 in the ultraviolet light emitting devices 100A to 100G shown in FIGS. 3 to 21, peripheries of the second conductive type semiconductor layer 336 and the second conductive type electrode layer 340 in the ultraviolet light emitting device 300 shown in FIG. 32 may have pattern portions which are surface-processed by cutting.

In addition, like that a random roughness is formed in at least one of upper and side parts of the substrate 180 in the ultraviolet light emitting devices 100H to 100J shown in FIGS. 22 to 24B, peripheries of the second conductive type semiconductor layer 336 and the second conductive type electrode layer 340 in the ultraviolet light emitting device 300 shown in FIG. 32 may be surface-processed to have random roughnesses as pattern portions.

The contents described with reference to FIGS. 3 to 31 may be applied to a case in which the second conductive type semiconductor layer 336 and the second conductive type electrode layer 340 correspond to light-transmitting layers and a detailed explanation thereof is thus omitted.

As such, peripheries of the second conductive type semiconductor layer 336 and the second conductive type electrode layer 340 in the vertical-type ultraviolet light emitting device 300 have the cut pattern portions 336A and 340A, as shown in FIG. 32. However, conventional second conductive type electrode layer 360 and second conductive type semiconductor layer 362 have no pattern portion. Accordingly, light emitted from the active layer 334 undergoes total internal reflection in an arrow direction 370, is absorbed in the light emitting device 300, instead of escaping from the light emitting device 300, thus causing deterioration in luminous efficacy.

However, according to the present embodiment, at least one of upper and side parts of the second conductive type semiconductor layer 336 and the second conductive type electrode layer 340 which are light-transmitting layers has pattern portions, thus enabling light emitted from the active layer 334 to escape from the light emitting device 300 in the arrow direction 372, instead of undergoing total reflection, and improving light extraction efficiency.

In the ultraviolet light emitting device according to the present embodiment, at least one of side and upper parts of the substrate which is a light-transmitting layer in case of a flip type or at least one of side and upper parts of the second conductive type semiconductor layer and the second conductive type electrode layer which are light-transmitting layers in case of a vertical-type has a cut portion or a random roughness, has both a cut portion and a random roughness, and/or has a photonic crystal structure, thus helping light which exits to a side part of the light-transmitting layer, light absorbed in the light-transmitting layer, instead of escaping therefrom, and/or light which is difficult to escape from the light-transmitting layer, to escape to an outside of the light-transmitting layer, in particular, to the upper part of the light-transmitting layer and improving light extraction efficiency (or extraction quantum efficiency). Furthermore, light extraction efficiency can be readily improved by imparting a pattern portion to the light-transmitting layer, without greatly changing an inner configuration of the light emitting structure or a chip structure.

<Ultraviolet Light Emitting Device Package>

Hereinafter, a configuration and operation of a light emitting device package including the ultraviolet light emitting device 100A shown in FIG. 3 will be described with reference to the drawings below. For convenience of description, the following description is based on the assumption that the light emitting device package includes the ultraviolet light emitting device 100A shown in FIG. 3. However, the following description may be similarly applied, even in case that any of the ultraviolet light emitting devices 100B to 100R shown in FIGS. 8, 10, 12, 16, 18, 20, 22, 24A, 24B, 29A to 29G and 30 is included in the light emitting device package.

Figure 33:
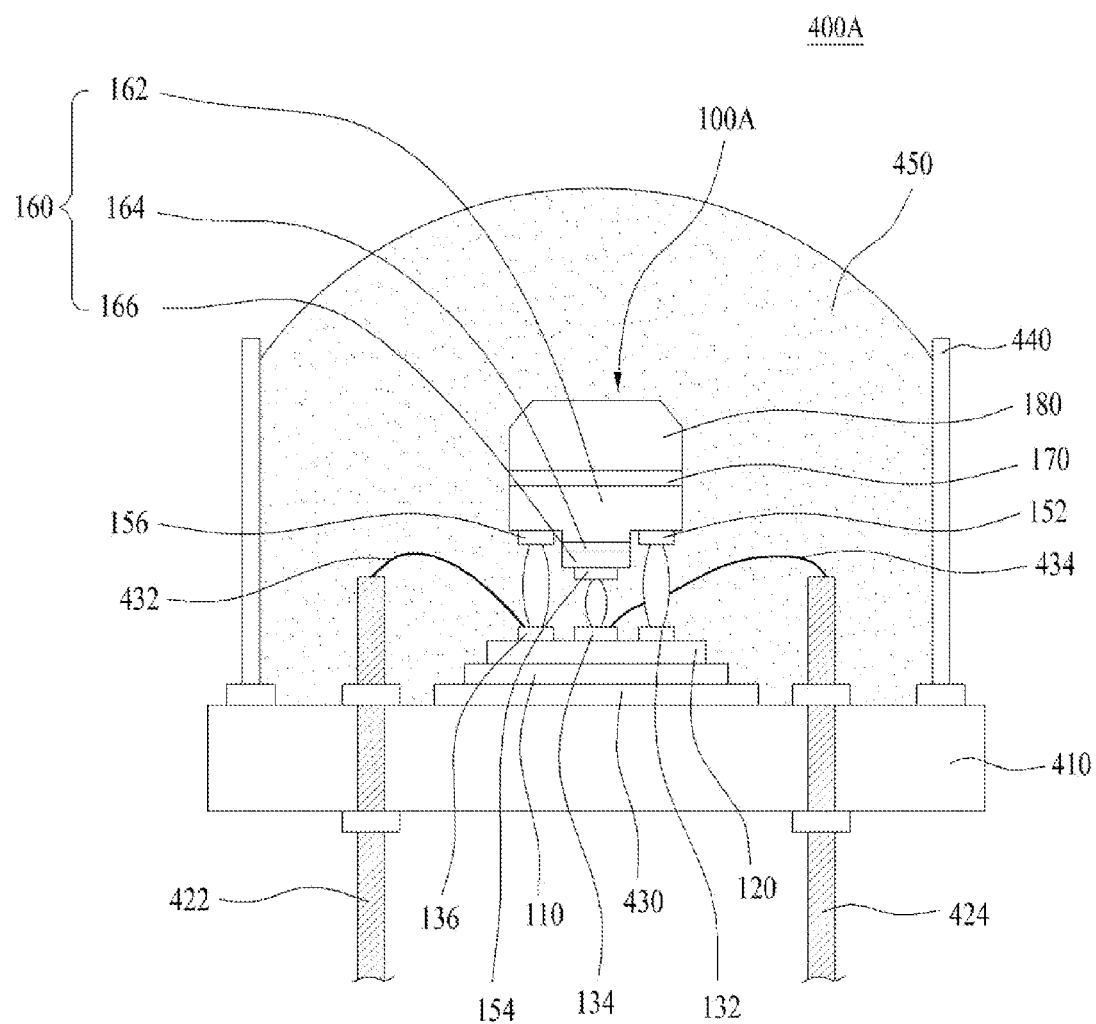
FIG. 33 is a sectional view illustrating a light emitting device package according to one embodiment.

FIG. 33 is a sectional view illustrating a light emitting device package 400A according to one embodiment.

The light emitting device package 400A according to one embodiment includes the ultraviolet light emitting device 100A, a header 410, a pair of lead lines 422 and 424, an adhesion member 430, wires 432 and 434, a side wall 440 and a molding member 450. The light emitting device 100A is a light emitting device shown in FIG. 3. Accordingly, like reference numerals are used throughout the drawings and a detailed explanation thereof is thus omitted.

The submount 110 is connected through the adhesion member 430 to the header 410. The adhesion member 430 may employ a solder or paste type adhesive. First electrode pads 132 and 136 of the ultraviolet light emitting device 100A are connected to the lead line 422 through the wire 432. A second electrode pad 134 of the ultraviolet light emitting device 100A is connected to the lead line 424 through the wire 434. The wire 432 electrically connecting the first electrode pad 136 to the lead line 422 is illustrated, but a wire connecting the first electrode pad 132 to the lead line 422 is not illustrated. The reason for this is that the first and second electrode pads 132 and 136 are electrically connected to each other. However, the disclosure is not limited thereto. The first electrode pad 132 and the lead line 422 may be electrically connected to each other by a separate wire.

Power is supplied to the light emitting device 100A through the lead lines 422 and 424 insulated from each other.

The molding member 450 fills a cavity of the package 400A formed by the side wall 440 and surrounds the light emitting device 100A to protect the same. In addition, the molding member 450 includes a phosphor and thereby changes a wavelength of light emitted from the light emitting device 100A.

Figure 34:
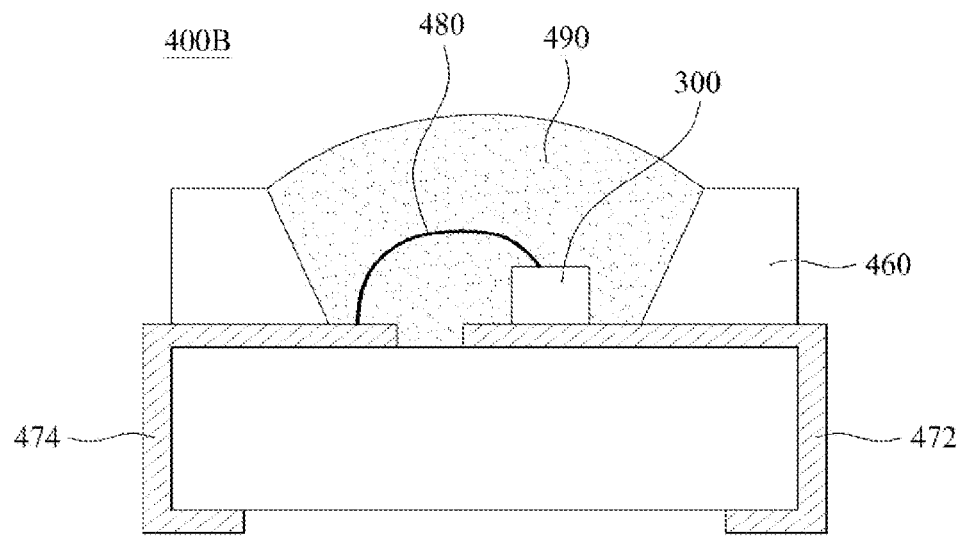
FIG. 34 is a sectional view illustrating a light emitting device package according to another embodiment.

FIG. 34 is a sectional view illustrating a light emitting device package 200B according to another embodiment.

The light emitting device package 400B according to the another embodiment includes a package body 460, first and second lead frames 472 and 474 mounted in the package body 460, a light emitting device 300 disposed in the package body 460 and electrically connected to the first and second lead frames 472 and 474, and a molding member 490 surrounding the light emitting device 300.

The package body 460 may contain silicone, a synthetic resin or a metal and an inclined plane may be formed around the ultraviolet light emitting device 300.

The first and second lead frames 472 and 474 are electrically insulated from each other and function to supply power to the ultraviolet light emitting device 300. In addition, the first and second lead frames 472 and 474 function to reflect light emitted from the ultraviolet light emitting device 300 to increase luminous efficacy and to discharge heat radiated from the ultraviolet light emitting device 300 to the outside.

The light emitting device 300 may be the vertical-type light emitting device shown in FIG. 32, but the disclosure is not limited thereto. The light emitting device 300 may be disposed on the first lead frame 472, as shown in FIG. 34, or be disposed on the second lead frame 474 or the package body 460.

The ultraviolet light emitting device 300 is electrically directly connected to the first lead frame 472 and is electrically connected to the second lead frame 474 through the wire 480, but the disclosure is not limited thereto. Unlike the illustration of FIG. 34, the ultraviolet light emitting device 300 may be electrically connected to the first and second lead frames 472 and 474 through respective wires.

The molding member 490 surrounds the ultraviolet light emitting device 300 to protect the same. In addition, the molding member 490 includes a phosphor to change a wavelength of light emitted from the ultraviolet light emitting device 300.

The light emitting device package according to the another embodiment includes a plurality of light emitting device packages arrayed on a substrate, and a light guide plate, a prism sheet, a diffusion sheet, a fluorescence sheet, and the like as optical members may be arranged on a light passage of the light emitting device packages. The light emitting device package, the substrate and the optical member may serve as a backlight unit or a lighting unit. For example, lighting systems may include backlight units, lighting units, indicator devices, lamps, streetlamps and the like.

<Lighting Unit>

Figure 35:
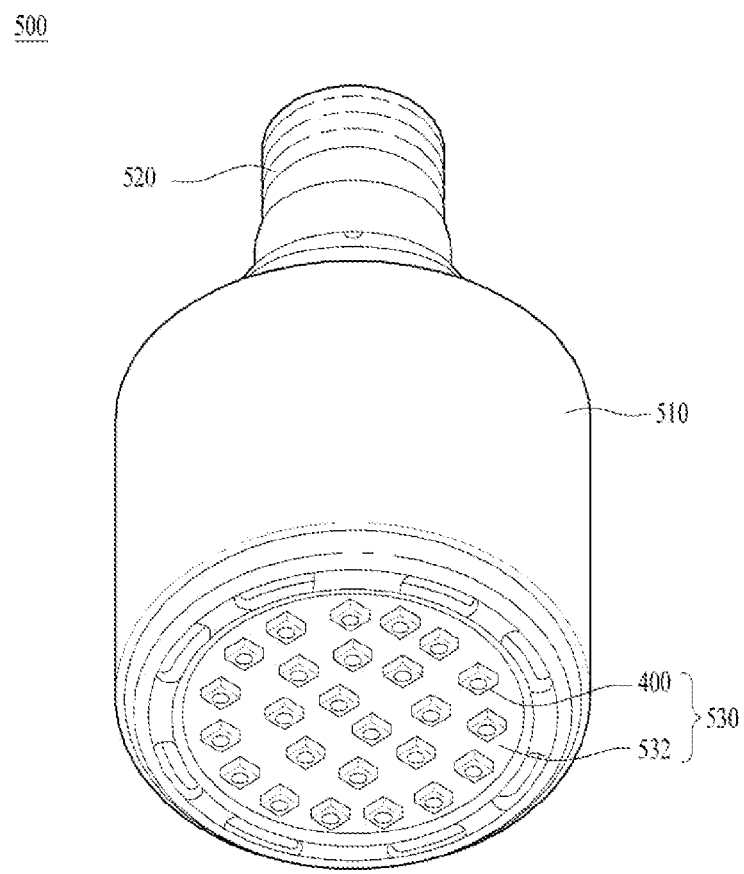
FIG. 35 is a perspective view illustrating a lighting unit according to one embodiment.

FIG. 35 is a perspective view illustrating a lighting unit 500 according to one embodiment. The lighting unit 500 of FIG. 35 is given as an example of the lighting system, but the disclosure is not limited thereto.

In the present embodiment, the lighting unit 500 includes a case body 510, a connection terminal 520 mounted in the case body 510 and receiving power from an exterior power supply, and a light emitting module unit 530 mounted in the case body 510.

The case body 510 is formed of a material having superior heat radiation property such as a metal or a resin.

The light emitting module unit 530 may include a substrate 532 and at least one light emitting device package 400 (400A or 400B) mounted on the substrate 532.

The substrate 532 may include a circuit pattern-printed insulator such as general printed circuit board (PCB), a metal core PCB, a flexible PCB or a ceramic PCB.

In addition, the substrate 532 may be formed of a material capable of efficiently reflecting light, or a material having a surface color, such as white or silver, enabling efficient reflection of light.

At least one light emitting device package 400 (400A or 400B) may be mounted on the substrate 532. Each light emitting device package 400 (400A or 400B) may include at least one ultraviolet light emitting device 100A to 100R, or 300.

The light emitting module unit 530 may have an arrangement including a variety of combinations of the light emitting device package 400 (400A or 400B) in order to obtain desired color and brightness. For example, the light emitting module unit 530 may have a combination of a white light emitting diode, a red light emitting diode and a green light emitting diode in order to secure high color rendering index (CRI).

The connection terminal 520 is electrically connected to the light emitting module unit 530 to supply power. In the present embodiment, the connection terminal 520 is screwed and coupled to the exterior power supply, but the disclosure is not limited thereto. For example, the connection terminal 520 having a pin shape may be inserted into the exterior power supply or be connected to the exterior power supply via a wire.

<Backlight Unit>

Figure 36:
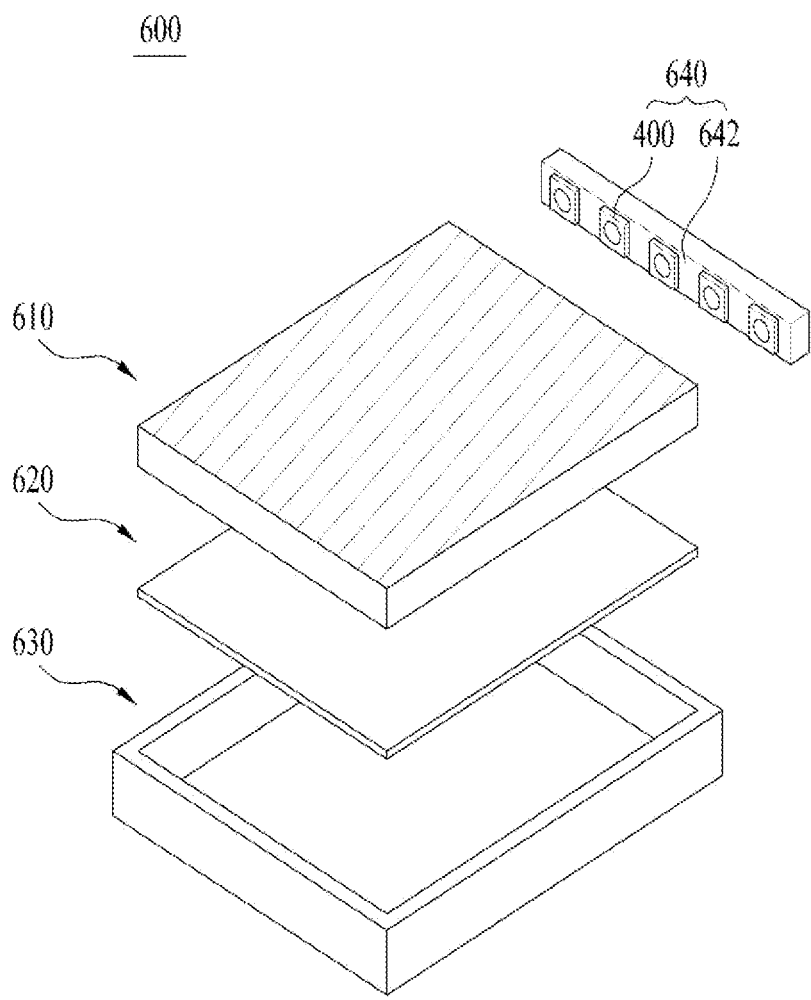
FIG. 36 is an exploded perspective view illustrating a backlight unit according to one embodiment.

FIG. 36 is an exploded perspective view illustrating a backlight unit 600 according to one embodiment. The backlight unit 600 of FIG. 36 is given as an example of the lighting system, but the disclosure is not limited thereto.

The backlight unit 600 according to the embodiment includes a light guide plate 610, a reflective member 620 disposed under the light guide plate 610, a bottom cover 630, and a light emitting module unit 640 to supply light to the light guide plate 610. The bottom cover 630 accommodates a light guide plate 610, a reflective member 620 and a light emitting module unit 640.

The light guide plate 610 functions to diffuse light and thereby realize surface illumination. The light guide plate 610 is formed of a transparent material, for example, an acrylic resin such as polymethyl methacrylate (PMMA), polyethylene terephthlate (PET), polycarbonate (PC), a cycloolefin copolymer (COC) or a polyethylene naphthalate (PEN) resin.

The light emitting module unit 640 supplies light to at least one side of the light guide plate 610 and functions ultimately as a light source of a display device on which a backlight unit is mounted.

The light emitting module unit 640 may contact the light guide plate 610, but the disclosure is not limited thereto. Specifically, the light emitting module unit 640 includes a substrate 642 and a plurality of light emitting device packages 400 (400A and 400B) mounted on the substrate 642. The substrate 642 may contact the light guide plate 610, but the disclosure is not limited thereto.

The substrate 642 may be a PCB including a circuit pattern (not shown). The substrate 642 may include not only a general PCB but also a metal core PCB (MCPCB), a flexible PCB or the like, but the disclosure is not limited thereto.

In addition, the light emitting device packages 400 (400A and 400B) may be disposed on the substrate 642 such that light-emitting surface emitting light is spaced from the light guide plate 610 by a predetermined distance.

The reflective member 620 may be formed under the light guide plate 610. The reflective member 620 reflects light incident upon the lower surface of the light guide plate 610 upwardly to improve brightness of the backlight unit. The reflective member 620 is formed of a PET, PC, PVC resin or the like, but the disclosure is not limited thereto.

The bottom cover 630 may accommodate the light guide plate 610, the light emitting module unit 640, the reflective member 620 and the like. For this purpose, the bottom cover 630 may have a box shape having an open top surface, but the disclosure is not limited thereto.

The bottom cover 630 may be formed of a metal or resin by a process such as press molding or extrusion molding.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
an active layer emitting light; and
a light-transmitting layer disposed on the active layer, the light-transmitting layer having a lower part facing the active layer,
wherein at least one of side or upper parts of the light-transmitting layer has a surface-processed pattern portion, and
wherein the pattern portion is disposed in a total internal reflection region, the total internal reflection region being defined as follows:

$$\left(\frac{a+b_1}{2}\right)\tan\theta_{TIR} < y < h$$

$$0 < x < \frac{b_1-a}{2} - h\tan\theta_{TIR}, \frac{a+b_1}{2} + h\tan\theta_{TIR} < x < b_1$$

where 'y' represents a position of the light-transmittin layer in a thickness direction, 'x' represents a position of the light-transmitting layer in a width direction, 'a' represents a width of the active layer, $b_1$ represents a width of the lower surface of the light-transmitting layer, $\theta_{TIR}$ represents a total internal reflection angle of the light-transmitting layer, and h represents a thickness of the light-transmitting layer.

2. The light emitting device according to claim 1, wherein the active layer emitting light has a wavelength band of 200 nm to 405 nm.

3. The light emitting device according to claim 1, wherein the pattern portion is disposed in at least one of the upper part of the light-transmitting layer, or upper portion of the side part of the light-transmitting layer.

4. The light emitting device according to claim 3, wherein the pattern portion is further disposed in at least one of lower portion or intermediate portion of the side part of the light-transmitting layer.

5. The light emitting device according to claim 3, wherein the pattern portion is surface-processed to provide random roughness, or is surface-processed into a hemispherical shape.

6. The light emitting device according to claim 5, wherein the surface-processing comprises at least one of lapping and polishing, a roughness level of the random roughness is proportional to a polishing particle size, and the surface-processing comprises laser scribing, wet etching, or dry etching.

7. The light emitting device according to claim 1, wherein the pattern portion is surface-processed such that an upper surface and a lower surface of the light-transmitting layer have areas different from each other.

8. The light emitting device according to claim 7, wherein the light-transmitting layer comprises:
a lower cut portion having a horizontal cross-section having the same shape as the lower surface; and
an upper cut portion being disposed on the lower cut portion and having a plurality of different horizontal cross-sections between an upper surface of the lower cut portion, and the upper surface of the light-transmitting layer.

9. The light emitting device according to claim 7, wherein a side part of the upper cut portion has at least one inclined plane.

10. The light emitting device according to claim 9, wherein the surface of the inclined plane has a roughness or the inclined plane has a concave or convex curvature at an outside.

11. The light emitting device according to claim 9, wherein the following relation is present between a width of the upper surface and a width of the lower surface, of the light-transmitting layer;

$$b_1 - b_2 = 2d\tan\theta_1$$

where $b_1$ represents the width of the lower surface, $b_2$ represents the width of the upper surface, 'd' represents a thickness of the upper cut portion and $\theta_1$ represents an inclination angle of the inclined plane.

12. The light emitting device according to claim 9, wherein the upper cut portion has a head-truncated pyramidal shape, the upper cut portion has at least one projection at an edge thereof, or the upper cut portion has a reverse head-truncated pyramidal shape.

13. The light emitting device according to claim 1, wherein the upper part of the light-transmitting layer has uniform irregularities as the pattern portion.

14. The light emitting device according to claim 1, further comprising:
a substrate;
a first conductive type semiconductor layer disposed between the substrate and the active layer; and
a second conductive type semiconductor layer disposed on the active layer,
wherein the light-transmitting layer comprises the second conductive type semiconductor layer.

15. The light emitting device according to claim 14, further comprising a second conductive type electrode layer disposed on the second conductive type semiconductor layer,
wherein the light-transmitting layer further comprises the second conductive type electrode layer.

16. The light emitting device according to claim 1, further comprising:
a first conductive type semiconductor layer disposed on the active layer;
a second conductive type semiconductor layer disposed under the active layer; and
a substrate disposed on the first conductive type semiconductor layer,
wherein the light-transmitting layer comprises the substrate.

17. The light emitting device according to claim 4, wherein the lower portion of the side part of the light-transmitting layer in which the pattern portion is disposed is defined as follows:

$$0 < y < \frac{b_1}{2}$$

where 'y' represents a position of the light-transmitting layer in a thickness direction and b1 represents a width of the lower surface of the light-transmitting layer.

18. The light emitting device according to claim 9, wherein the light-transmitting layer has a width of 50 μm to 250 μm, the lower cut portion has a thickness of 25 μm to 100μm, and the inclined plane has an inclination angle of 30° to 40°.

19. A light emitting device, comprising:
an active layer emitting light; and
a light-transmitting layer disposed on the active layer, the light-transmitting layer having a lower part facing the active layer,
wherein at least one of side or upper parts of the light-transmitting layer has a surface-processed pattern portion,
wherein the pattern portion is surface-processed such that an upper surface and a lower surface of the light-transmitting layer have areas different from each other,
wherein a side part of the upper cut portion has at least one inclined plane, and
wherein the light-transmitting layer has a width of 50 μm to 250 μm, the lower cut portion has a thickness of 25 μm to 100 μm, and the inclined plane has an inclination angle of 30° to 40°.

20. A light emitting device, comprising:
a light emitting structure comprising a p-type semiconductor layer, an active layer emitting light and an n-type AlGaN layer; and
a sapphire substrate disposed on the n-type AlGaN layer and having a lower part facing the active layer,
wherein a pattern portion having roughness is formed in at least one of a lower portion of the side part of the sapphire substrate and an edge of the upper part of the sapphire substrate, and
wherein the lower portion of the side part of the sapphire substrate is defined as follows:

$$0 < y < \frac{b_1}{2}$$

where 'y' represents a position of the sapphire in a thickness direction and $b_1$ represents a width of the lower surface of the sapphire substrate, and the edge of the upper part is defined as follows:

$$0 < x < \frac{b_1 - a}{2} - h\tan\theta_{TIR}, \frac{a + b_1}{2} + h\tan\theta_{TIR} < x < b_1$$

where 'x' represents a position of the sapphire substrate in a width direction, 'a' represents a width of the light emitting structure, $b_1$ represents a width of the lower surface of the sapphire substrate, $\theta_{TIR}$ represents a total internal reflection angle of the sapphire substrate and h represents a thickness of the sapphire substrate.

* * * * *